(12) United States Patent
Nagashima et al.

(10) Patent No.: US 9,332,618 B2
(45) Date of Patent: May 3, 2016

(54) ILLUMINATOR CONTROLLED WITH TOUCHLESS SENSOR

(71) Applicant: ROHM CO., LTD., Kyoto-shi, Kyoto (JP)

(72) Inventors: Yoshiaki Nagashima, Kyoto (JP); Masaru Igaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/682,530

(22) Filed: Apr. 9, 2015

(65) Prior Publication Data

US 2015/0216020 A1 Jul. 30, 2015

Related U.S. Application Data

(63) Continuation of application No. 13/590,449, filed on Aug. 21, 2012, now Pat. No. 9,028,090.

(30) Foreign Application Priority Data

| Aug. 26, 2011 | (JP) | 2011-185177 |
| Aug. 31, 2011 | (JP) | 2011-189840 |
| Jul. 13, 2012 | (JP) | 2012-157516 |

(51) Int. Cl.

| *G06F 1/32* | (2006.01) |
| *F21V 23/04* | (2006.01) |
| *H05B 37/02* | (2006.01) |
| *H05B 33/08* | (2006.01) |
| *F21K 99/00* | (2016.01) |
| *F21V 3/02* | (2006.01) |

(Continued)

(52) U.S. Cl.
CPC ............. *H05B 37/0227* (2013.01); *F21K 9/17* (2013.01); *F21V 23/0471* (2013.01); *H05B 33/0803* (2013.01); *F21K 9/1355* (2013.01); *F21V 3/02* (2013.01); *F21Y 2101/02* (2013.01); *F21Y 2103/003* (2013.01)

(58) Field of Classification Search
None
See application file for complete search history.

(56) References Cited

U.S. PATENT DOCUMENTS

| 4,450,351 A | 5/1984 | Fraden | |
| 5,699,243 A * | 12/1997 | Eckel | H05B 37/0227 315/159 |

(Continued)

FOREIGN PATENT DOCUMENTS

| JP | 9-54233 | 2/1997 |
| JP | 3060478 | 4/2000 |

(Continued)

*Primary Examiner* — Douglas W Owens
*Assistant Examiner* — Dedei K Hammond
(74) *Attorney, Agent, or Firm* — Hamre, Schumann, Mueller & Larson, P.C.

(57) ABSTRACT

An LED lamp includes LED chips, a translucent cover housing the LED chips, a motion sensor unit, a condensing lens, and a power unit. The motion sensor unit includes a light receiving element for light of a predetermined wavelength. The lens condenses light of the predetermined wavelength onto the light receiving element. The power unit controls the state of operation of the LED chips based on an output from the motion sensor unit. The motion sensor unit includes a light shielding member disposed to overlap the light receiving element in an optical axis direction of the condensing lens and also to surround the light receiving element as viewed in the optical axis direction. The light shielding member is made of a material having a lower light transmissivity than that of the condensing lens for a range of wavelengths including the predetermined wavelength.

16 Claims, 23 Drawing Sheets

(51) Int. Cl.
*F21Y 101/02* (2006.01)
*F21Y 103/00* (2016.01)

(56) References Cited

U.S. PATENT DOCUMENTS

| | | | |
|---|---|---|---|
| 7,264,380 B1 | 9/2007 | Monroe et al. | |
| 7,758,234 B1 | 7/2010 | Savicki et al. | |
| 2004/0207341 A1* | 10/2004 | Callahan | G09F 9/33 315/291 |
| 2006/0044800 A1* | 3/2006 | Reime | B60Q 3/001 362/276 |
| 2012/0043910 A1* | 2/2012 | Nagashima | H05B 37/0227 315/294 |
| 2012/0098465 A1* | 4/2012 | Rothschild | H05B 37/02 315/360 |
| 2012/0235579 A1* | 9/2012 | Chemel | F21S 2/005 315/152 |

FOREIGN PATENT DOCUMENTS

| | | |
|---|---|---|
| JP | 2002-26369 | 1/2002 |
| JP | 2010-80139 | 4/2010 |
| JP | 2011-28868 | 2/2011 |

* cited by examiner

FIG. 7
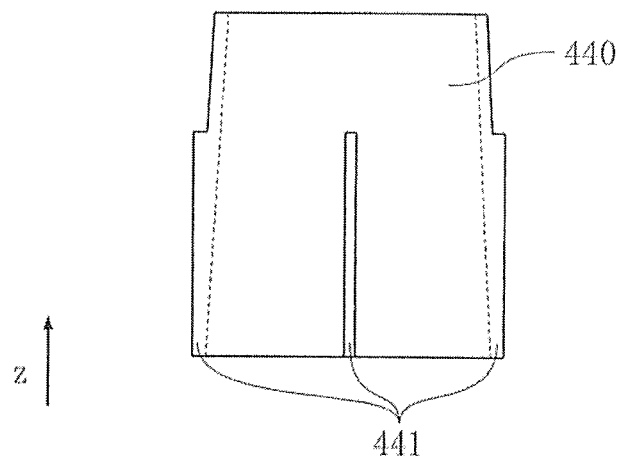
FIG. 8
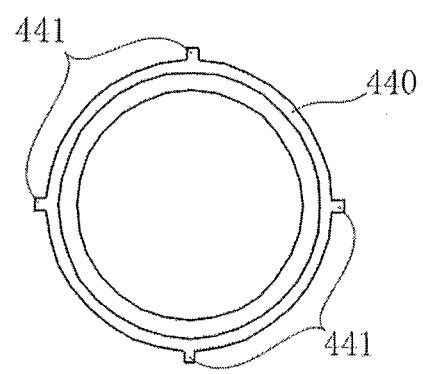

FIG. 11
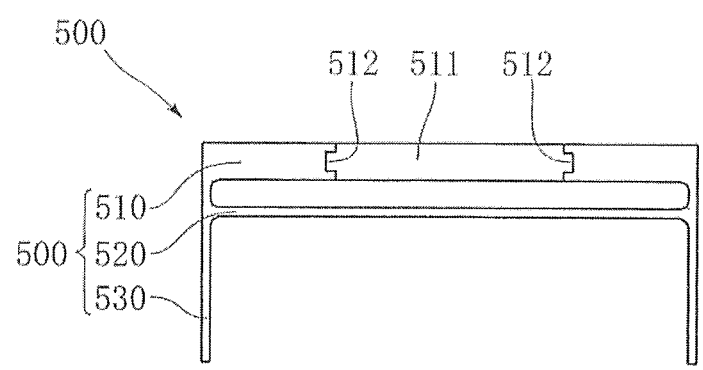
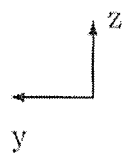

○ Non-defective
△ Needs adjustment
× Defective

| Case | Judgment | (A) $L_R < L2$ | (B) $L2 \leqq L_R \leqq L3$ | (C) $L_R > L3$ |
|---|---|---|---|---|
| 1 | ○ | Hv | Hv | Lv |
| 2 | △ | Hv | Hv | Hv |
| 3 | △ | Hv | Lv | Lv |
| 4 | × | Lv | Lv | Lv |
| 5 | × | Lv | Hv | Lv |
| 6 | × | Lv | Hv | Hv |
| 7 | × | Hv | Lv | Lv |
| 8 | × | Hv | Lv | Hv |

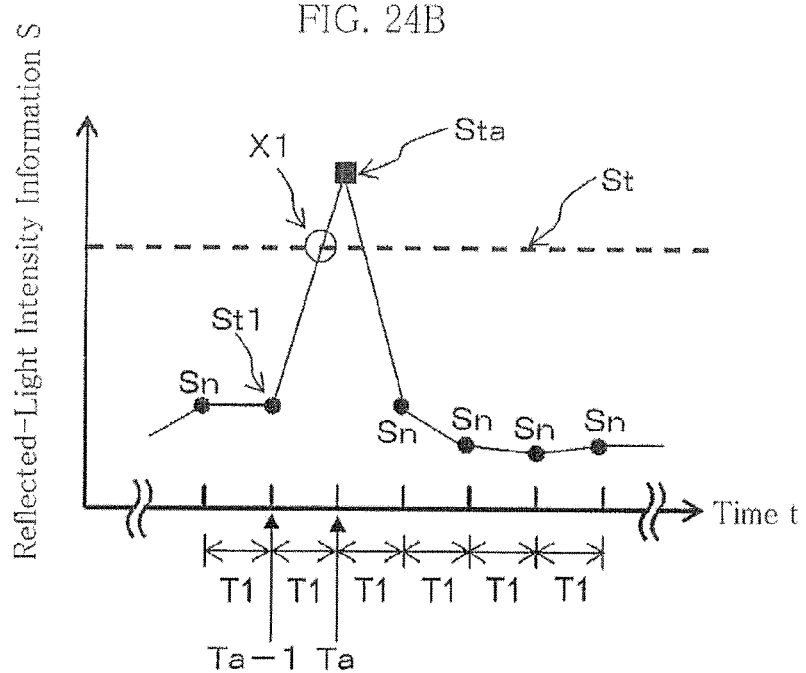
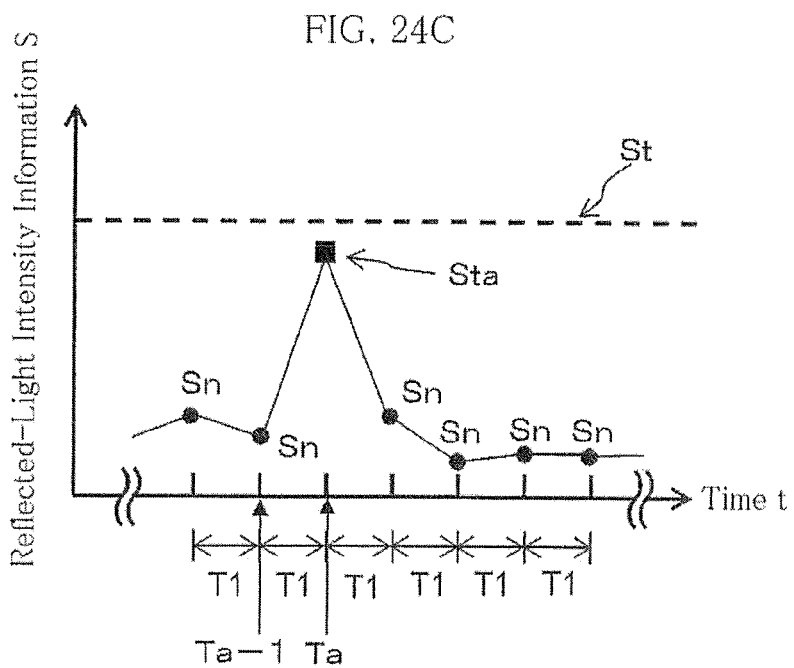

ILLUMINATOR CONTROLLED WITH TOUCHLESS SENSOR

This application is a Continuation of U.S. Ser. No. 13/590,449, filed Aug. 21, 2012, which application is incorporated herein by reference.

BACKGROUND OF THE INVENTION

1. Field of the Invention

The present invention relates to an LED lamp provided with a motion sensor unit.

2. Description of the Related Art

FIG. 16 shows a conventional LED lamp (see Patent Document 1 for example). The illustrated LED lamp 900, which can be used as an alternative to a traditional straight-tube fluorescent lamp, includes a plurality of LED (Light Emitting Diode) chips 91. The LED chips 91 are encased in a cylindrical translucent cover 94. The translucent cover 94 allows the light from the LED chips 91 to pass through while also diffusing the light. The translucent cover 94 is provided with a pair of caps 92 at its respective ends. With the caps 92 connected to an unillustrated light fixture, commercial electric power of, e.g. 100 VAC (AC voltage), is supplied to the LED lamp 900. The LED lamp 900 includes a power unit (not illustrated) which converts the 100 VAC into DC power for the LED chips 91 to turn on. The LED lamp 900 also includes a motion sensor unit 93. The motion sensor unit 93 senses infrared rays irradiated from e.g. a human body and outputs a detection signal. Upon reception of the detection signal, the power unit performs lighting control, to turn on the LED chips 91 for a predetermined time for example.

However, the motion sensor unit 93, though supposed to sense infrared rays, may also respond to visible light besides infrared rays. Hence, light from the LED chips 91 may be detected by the motion sensor unit 93, thereby causing the LED lamp 900 to operate erroneously even when no moving object is present within the field of view of the sensor.

LEDs are also used as a source of light in lighting equipment such as a focal illuminator (so-called "task light") and a kitchen illuminator (see Patent Document 2, for example).

Focal illuminators using LEDs have an advantage that their cases can be made thinner than those using incandescent lamps or fluorescent lamps. Such a thin case, however, may be disadvantageous in that it is difficult to provide the case with operational members such as a power switch, a dimmer knob, etc.

Kitchen illuminators often need to be turned on or off with a wet hand, which poses safety risk as well as hygiene risk.

An effective way to handle the above problems may be to introduce a touchless operation system. The touchless operation can be implemented by conventional technique of combining an illuminator with an optical touchless sensor that uses non-contact sensing technology to detect a moving object or an approaching object.

Lighting Apparatus Provided with a Touchless Sensor.

An optical touchless sensor includes a light emitting device such as LED and LD (Laser Diode), and a light receiving element such as phototransistor and photodiode. The light emitting device emits light, so that the light will hit a target of detection and light reflected thereby will be received by the light receiving element, which will then converts the light into an electrical signal to identify a movement and/or position of the target. This method is advantageous in terms of light sensitivity and detection accuracy, and is suitable for proximity sensing, for example.

Touchless sensors can detect the position of a detection target such as a hand of a human operator. Thus, an illuminator with a touchless sensor, for example, can turn On/Off the light in a contactless fashion as the detection target is approaching the predetermined position.

However, with the optical touchless sensors, it is difficult to manufacture products with desired performance at a high yield rate, due to the variation in performance of the light emitting device and the light receiving element, or the variation in mounting accuracy of the components.

Patent Document 4 and Patent Document 5 disclose some examples of conventional optical touchless sensors.

Patent Documents

Patent Document 1: JP-A-2010-80139
Patent Document 2: JP-A-2011-28868
Patent Document 3: JP-B-3060478
Patent Document 4: JP-A-H09-54233
Patent Document 5: JP-A-2002-26369

SUMMARY OF THE INVENTION

The present invention has been proposed under the above-described circumstances, and it is therefore an object of the present invention to provide an LED lamp with reduced erroneous operation. Also, in view of the problems described thus far, it is another object of the present invention to provide an illuminator including a touchless sensor and a controller which provides improvement in product yield rate.

According to a first aspect of the present invention, there is provided an LED lamp provided with: a light source including at least one LED chip; a translucent cover for housing the LED chip and allowing light from the LED chip to pass through; a motion sensor unit including a light receiving element for receiving light of a predetermined wavelength, and a condensing lens for condensing light of the predetermined wavelength onto the light receiving element; and a power unit for controlling a state of operation of the LED chip based on an output from the motion sensor unit. The motion sensor unit includes a light shielding member that is disposed to overlap the light receiving element in an optical axis direction of the condensing lens and arranged to surround the light receiving element as viewed in the optical axis direction. The light shielding member is made of a material having a lower light transmissivity than that of the condensing lens for a range of wavelengths including the predetermined wavelength.

Preferably, the condensing lens is exposed from the translucent cover.

Preferably, the light shielding member is exposed from the translucent cover.

Preferably, the light of the predetermined wavelength is infrared light.

Preferably, the LED lamp of the first aspect is further provided with an elongated rectangular LED substrate and a pair of caps each attached to an end of the case. The translucent cover is cylindrical, and the light source includes a plurality of LED chips arranged on the LED substrate in a row extending in a longitudinal direction of the LED substrate.

Preferably, the motion sensor unit includes a transmissive cup housing the light receiving element, and the cup includes a tubular portion and the condensing lens. The light shielding member includes a light shielding tube surrounding the tubular portion of the cup.

Preferably, the motion sensor unit includes a metal cup that supports the light receiving element and is housed in the transmissive cup.

Preferably, the light shielding member includes a light shielding tube connected to the condensing lens.

Preferably, the motion sensor unit includes a metal cup that supports the light receiving element and is housed in the light shielding tube.

Preferably, the light shielding tube is formed with a projection for making contact with an inner surface of the translucent cover.

Preferably, the projection includes a plurality of ribs each elongated in the optical axis direction of the condensing lens.

Preferably, the projection includes at least four ribs.

Preferably, the light shielding member includes a metal cup supporting the light receiving element.

Preferably, the LED lamp of the first aspect is further provided with a heat dissipator to which the LED substrate is attached.

Preferably, the heat dissipator is formed with a power source storage for housing the power unit.

Preferably, the LED lamp of the first aspect is further provided with a sensor base made of a transparent material. The sensor base strides over the LED substrate and supports the motion sensor unit.

Preferably, the sensor base and one of the LED chips overlap with each other as viewed in a thickness direction of the LED substrate.

Preferably, the motion sensor unit includes a sensor substrate that indirectly supports the light receiving element, and the sensor base is formed with a fitting groove into which an end of the sensor substrate is inserted.

Preferably, the sensor base includes a separation wall disposed between the sensor substrate and the LED chips, and the separation wall is spaced apart from the sensor substrate.

Preferably, the translucent cover has an end formed with a cutout recessing in a longitudinal direction of the cover, and the condensing lens is exposed to an outside of the LED lamp via the cutout.

Preferably, the LED lamp of the first aspect is further provided with a shield plate filling a gap between the cutout and the motion sensor unit.

Preferably, one of the two caps is closer to the cutout than the other of the two cups, and the above-mentioned one of the two caps includes a shielding projection extending into the cutout.

Preferably, the LED lamp of the first aspect is further provided with an LED substrate and a cap, where the LED substrate supports the LED chip, and the cap is disposed opposite to the LED substrate with respect to the power unit. The translucent cover is dome-shaped, the motion sensor unit is supported by the LED substrate, and the translucent cover includes a top portion at which the condensing lens is exposed to an outside of the LED lamp.

According to the arrangements described above, any light other than travelling to the condensing lens is blocked by the light shielding member. Thus, it is possible to prevent light of the LED chips from reaching the light receiving element. Accordingly, the LED lamp is not erroneously turned on when the user or any other person is not within the area to be lit by the LED lamp.

According to a second aspect of the present invention, there is provided an illuminator that includes: a light source; a touchless sensor for non-contact detection of approach or movement of a detection target; and a controller for an ON/OFF control of the light source based on an output from the touchless sensor. In an embodiment of the second aspect, the controller includes a data memory for storage of reflected-light intensity information regarding a reflected light coming from the detection target to the touchless sensor, and the data memory is rewritable.

According to a third aspect of the present invention, there is provided an adjustment method for an illuminator, where the method includes:
(a) a step of preparing an illuminator which includes a touchless sensor and a detection target;
(b) a step of moving the detection target by a predetermined distance from the touchless sensor;
(c) a step of emitting light from the touchless sensor to hit the detection target;
(d) a step of detecting an intensity of light reflected by the detection target;
(e) a step of comparing the detected light intensity with a light intensity threshold value stored in the controller; and
(f) a step of determining whether or not a range in which the touchless sensor and the controller respond to the detection target is within a predetermined specification.

Preferably, the adjustment method of the third aspect further includes:
(g) a step of fixing the distance between the detection target and the touchless sensor to a predetermined distance and detecting an intensity of reflected infrared rays casted onto the touchless sensor; and
(h) a step of storing the detected reflected-light intensity information in the controller;
for a case where the range in which the touchless sensor and the controller respond to the detection target is not within the predetermined range.

Preferably, the adjustment method of the third aspect may include:
(i) a step of measuring the intensity of reflected infrared rays casted from the detection target to the touchless sensor based on a timing of a signal periodically sent from the controller.

According to the illuminators and the adjusting methods noted above, it is possible to adjust an operation of the touchless sensor even after the illuminators have been assembled if there are operational variations in the light emitting devices and the light receiving elements or if there are positional errors when mounting the light emitting devices and the light receiving elements. Thus, the present invention is capable of improving yield rate in the production process of the illuminators.

Other features and advantages of the present invention will become more apparent from detailed description given below with reference to the accompanying drawings.

BRIEF DESCRIPTION OF THE DRAWINGS

FIG. 7 is a front view of a light shielding tube in the motion sensor unit used in the LED lamp in FIG. 1.

FIG. 8 is a bottom view of the light shielding tube in the motion sensor unit used in the LED lamp in FIG. 1.

FIG. 11 is a rear view of the sensor base used in the LED lamp in FIG. 1.

FIG. 24B shows a time chart for describing a signal which is processed in a controller in a normal mode according to the present invention.

FIG. 24C shows a time chart for describing a signal which is processed in a controller in a normal mode according to the present invention.

DETAILED DESCRIPTION OF THE PREFERRED EMBODIMENTS

Figure 1:
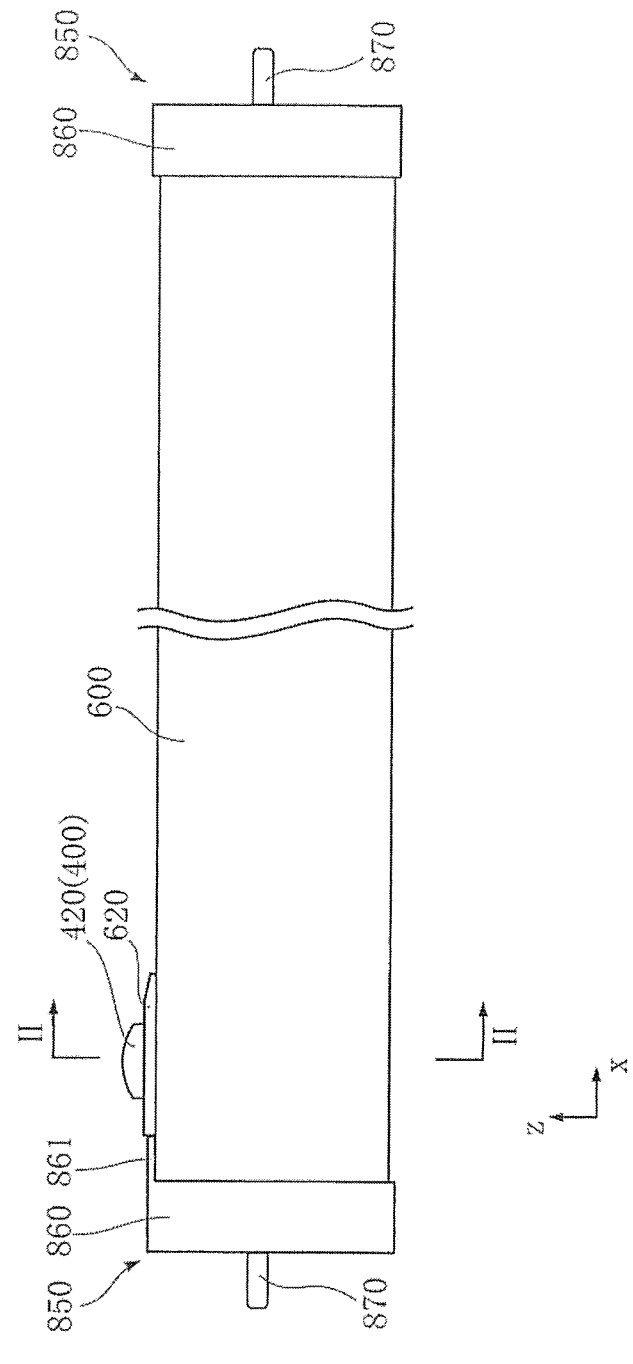
FIG. 1 is a front view showing a primary portion of an LED lamp according to a first embodiment of the present invention.

Preferred embodiments of the present invention will be described below with reference to the accompanying drawings.

FIG. 1 through FIG. 4 show an LED lamp according to a first embodiment of the present invention. The LED lamp 101 according to the present embodiment includes an LED substrate 200, a plurality of LED modules 300, a motion sensor unit 400, a sensor base 500, a translucent cover 600, a heat dissipator 700, a power unit 800 and a pair of caps (or bases) 850. The LED lamp 101 can be used as an alternative to a conventional straight tube fluorescent lamp, and is attachable to a light fixture for a straight tube fluorescent lamp. It should be noted here that FIG. 4 does not show the caps 850 for the sake of easier understanding. Note also, that including all of these figures and in each of the following embodiments, an optical axis direction z can be used as a reference for up-down directionality. Specifically, with reference to the optical axis direction z, an upper side represents the side closer to the floor of a room while a lower side represents the side closer to the ceiling when the fixture is in actual use.

The LED substrate 200 is rectangular, and elongated in a longitudinal direction x, and includes a base material which is made of an insulating material provided by a ceramic such as alumina or glass epoxy resin; and a wiring pattern which is formed on the base material. The LED substrate 200 supports a plurality of LED modules 300 while providing pathways for supplying the modules with electric power from the power unit 800.

Figure 5:
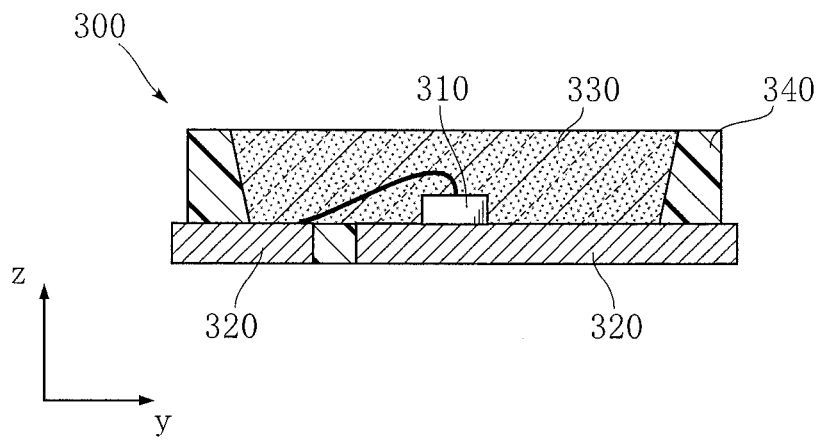
FIG. 5 is an enlarged sectional view of an LED module used in the LED lamp in FIG. 1.

The LED modules 300 serve as a light source of the LED lamp 101, and are disposed in the longitudinal direction x on the LED substrate 200 in the present embodiment. FIG. 5 is a sectional view of the LED modules 300 taken in a yz plane. As shown in the figure, each LED module 300 includes a pair of leads 320, a LED chip 310, sealing resin 330, and a reflector 340. The leads 320 are made of an Cu alloy for example, and one of the leads 320 is mounted with the LED chip 310. A surface of this lead 320, which is a surface facing away from the surface on which the LED chip 310 is mounted, is used as a terminal for making surface mounting of the LED module 300. The LED chip 310 is provided by a GaN semiconductor for example, and is capable of emitting blue light. The sealing resin 330 protects the LED chip 310. The sealing resin 330 is formed of translucent resin containing a fluorescent material which, when excited by the light from the LED chip 310, emits yellow light. With this arrangement, the LED module 300 is capable of emitting white light. The fluorescent material need not necessarily be one which emits yellow light, but instead, may be provided by a mixture of a material which emits red light and one which emits green light. The reflector 340 is made of a white resin for example, and reflects the light which is emitted sideways from the LED chip 310 in an upward direction.

The translucent cover 600 protects the LED modules 300, and allows the light therefrom to pass through while diffusing the light. The translucent cover 600 is made of opaque white polycarbonate resin for example, and is cylindrical. The translucent cover 600 is formed with a cutout 610. The cutout 610 is formed at an end region of the translucent cover 600 in the longitudinal direction x, to provide an inward recessing space with respect to the longitudinal direction x.

The motion sensor unit 400 detects presence of a user within a space served by the LED lamp 101, and includes a light receiving element 410, a transmissive cup 430, a light shielding tube 440, a metal cup 450 and a sensor substrate 460. The light receiving element 410 generates an electrical change upon reception of infrared rays, and is provided by e.g. a pyroelectric element in the present embodiment. The pyroelectric element generates a level of electromotive force in accordance with a change in infrared rays it receives. However, the light receiving element 410 may be provided by any other devices than a pyroelectric element as far as it is capable of detecting light reflected by a human body. The metal cup 450 is a bottomed cylinder made of iron or an iron alloy. On the bottom of the metal cup 450, the light receiving element 410 is attached, being exposed from the metal cup 450.

Figure 2:
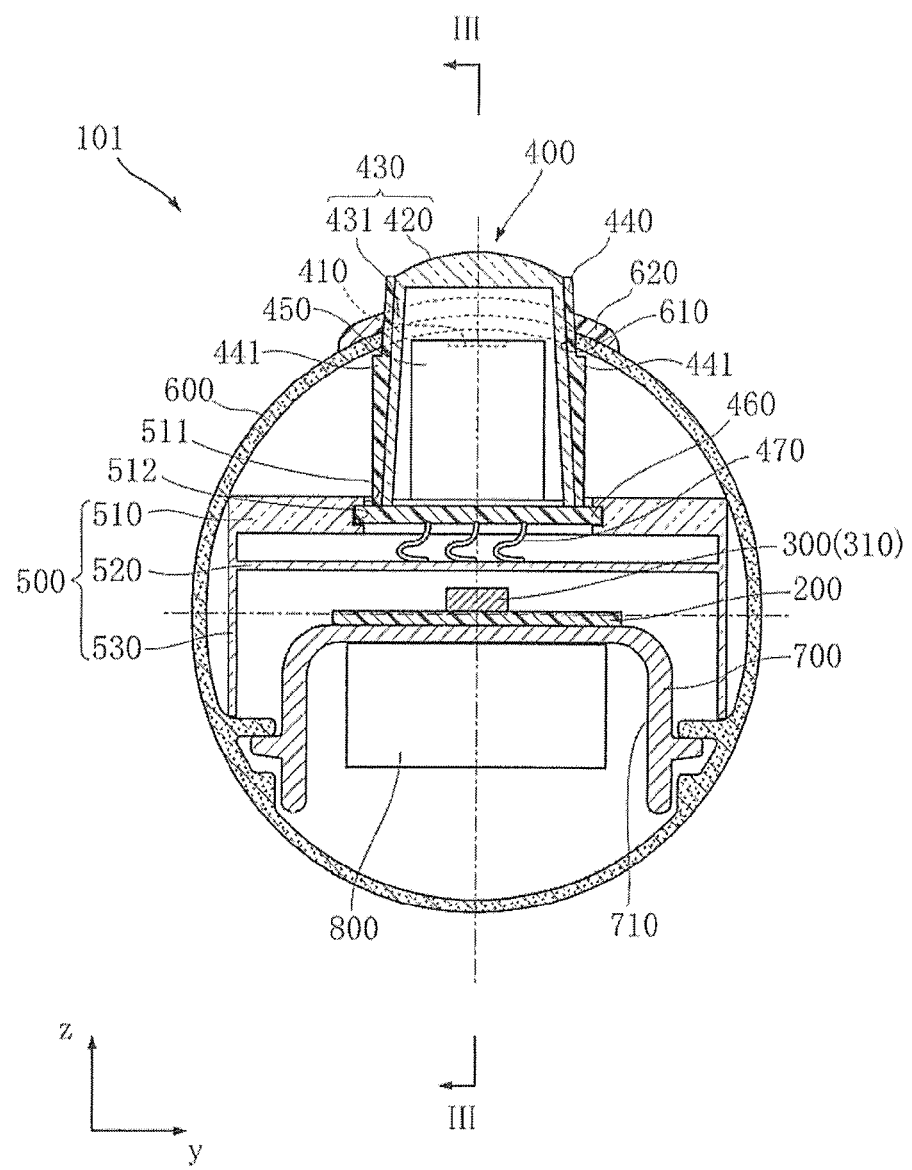
FIG. 2 is a sectional view taken in lines II-II in FIG. 1.
Figure 3:
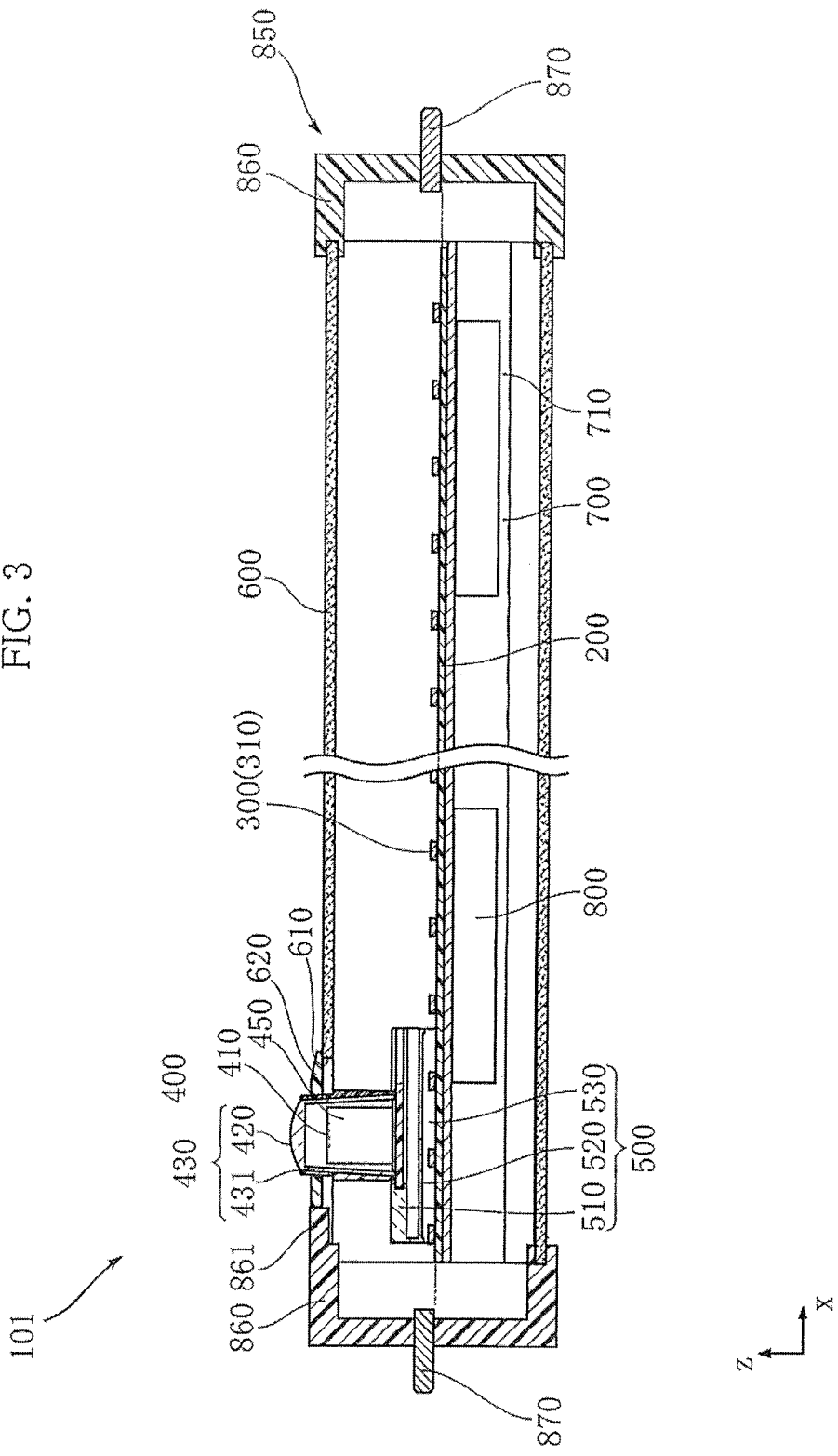
FIG. 3 is a sectional view of a primary portion taken in lines in FIG. 2.

The transmissive cup 430 is made of polycarbonate resin for example, or other material which has a relatively good translucency to infrared rays. Together with the metal cup 450 the transmissive cup 430 covers the light receiving element 410. The transmissive cup 430 includes a condensing lens 420 and a tubular portion 431. The condensing lens 420 collects light which is coming in the optical axis direction z and light which is coming askew to the optical axis direction z within a predetermined range of angles onto the light receiving element 410. As shown clearly in FIG. 6, the condensing lens 420 is constituted by a plurality of smaller lens surfaces in the present embodiment. As shown in FIG. 2 and FIG. 3, the tubular portion 431 extends downward from the condensing lens 420 in the optical axis direction z and is cylindrical in the present embodiment.

The condensing lens 420 is exposed from the cutout 610 of the translucent cover 600 in the upward direction in the optical axis direction z. Also, the light shielding tube 440 has its upper end region in the optical axis direction z exposed from the cutout 610 of the translucent cover 600 in the upward direction in the optical axis direction z. As shown clearly in FIG. 4 there is a gap between the cutout 610 of the translucent cover 600 and the motion sensor unit 400, which is sealed by a shield plate 620.

The light shielding tube 440, which represents an example of the light shielding member according to the present invention, covers the tubular portion 431 of the transmissive cup 430. The light shielding tube 440 is formed of a material which has a lower infrared ray transmissivity than a material of which the transmissive cup 430 (the condensing lens 420) is formed. Examples of such a material include polyethylene resin, polypropylene resin, polyethylene resin and PET resin. Also, it is preferable that the material for the light shielding tube 440 selected from those listed above has a lower visible light transmissivity than the above-listed materials of which the condensing lens 420 is formed.

Figure 6:
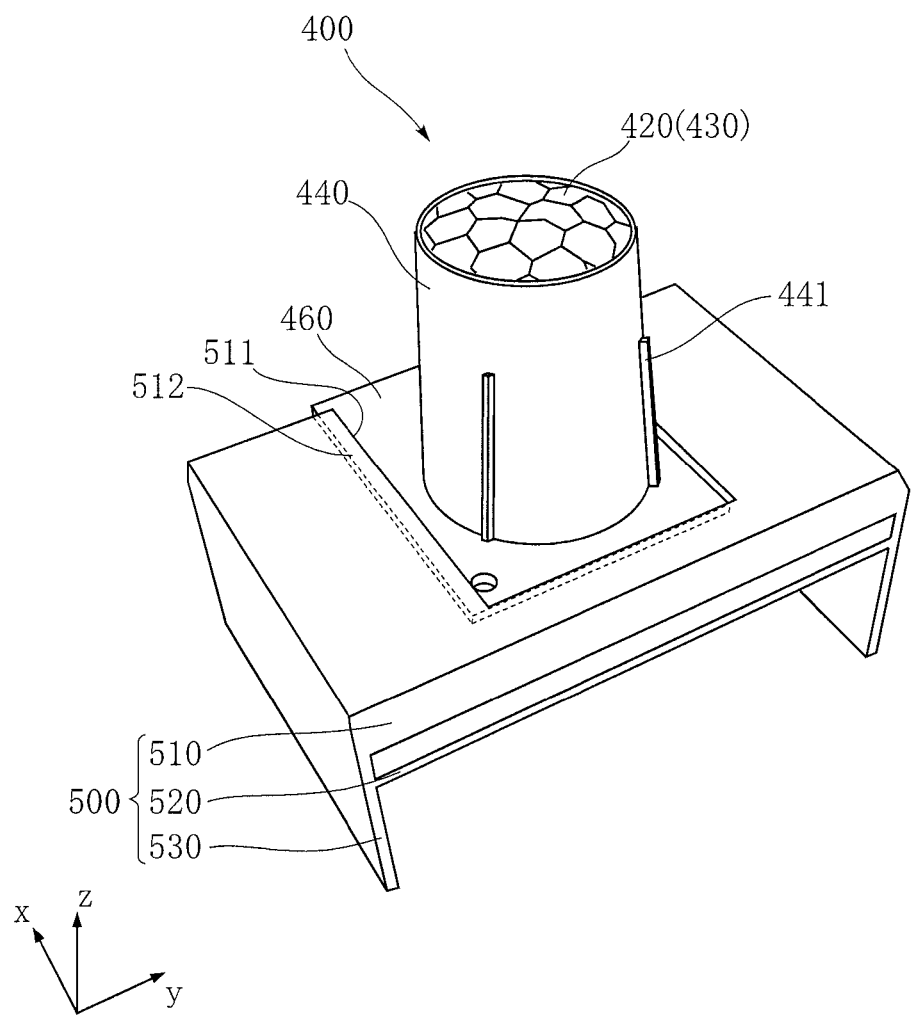
FIG. 6 is a perspective view of a motion sensor unit and a sensor base used in the LED lamp in FIG. 1.

As shown clearly in FIG. 6 through FIG. 8, the light shielding tube 440 is formed with four ribs 441. The four ribs 441 are disposed at an approximately 90 degree angular interval as viewed from the optical axis direction z. Each of the ribs 441 extends long in the optical axis direction z. As shown in FIG. 2, the ribs 441 have their upper ends in the optical axis direction z in contact with or in very close to an inner surface of the translucent cover 600. In the present embodiment, the upper end of the light shielding tube 440 in the optical axis direction z aligns with a lower end of the condensing lens 420 in the optical axis direction z whereas a lower end of the light shielding tube 440 in the optical axis direction z aligns with a lower end of the transmissive cup 430 in the optical axis direction z.

The sensor substrate 460 supports the metal cup 450, the transmissive cup 430 and the light shielding tube 440. The sensor substrate 460 is provided by a printed wiring substrate of glass epoxy resin. The sensor substrate 460 is mounted with electronic parts (not illustrated) for outputting a detection signal based on changes in the electromotive force generated by the light receiving element 410. Cables 470 extend from the sensor substrate 460. The cables 470 provide a transmission path for sending the detection signal to the power unit 800.

Figure 9:
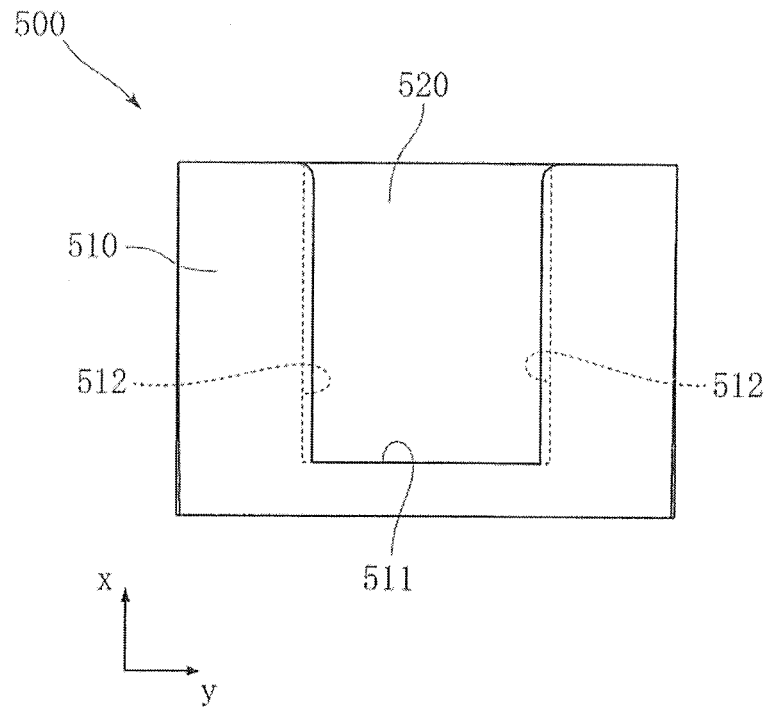
FIG. 9 is a plan view of the sensor base used in the LED lamp in FIG. 1.
Figure 10:
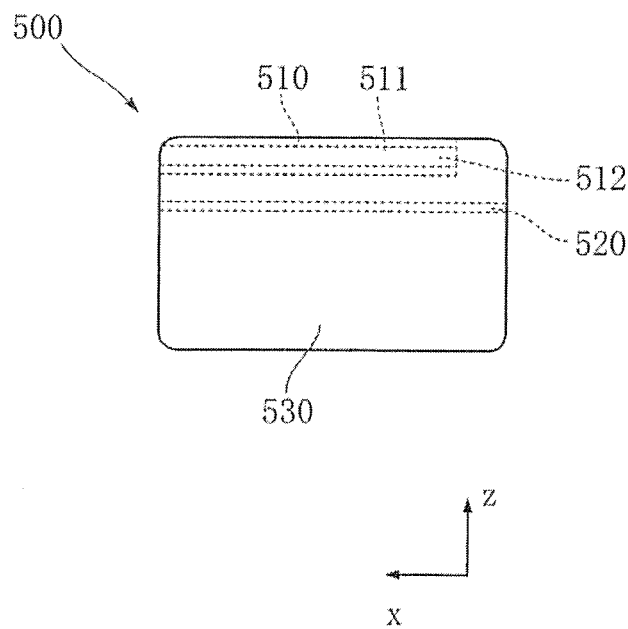
FIG. 10 is a side view of the sensor base used in the LED lamp in FIG. 1.

The sensor base 500 supports the motion sensor unit 400, and as shown in FIG. 9 through FIG. 11, has an upper wall 510, a separation wall 520, and a pair of leg walls 530. In the present embodiment, the sensor base 500 is made of transparent resin provided by acrylic resin for example. The sensor base 500 has a generally U shaped member as a whole, opening in the optical axis direction z, striding over part of the LED substrate 200 and several of the LED modules 300. Especially in the present embodiment, the sensor base 500 aligns at least one of the LED modules 300 in the optical axis direction z.

The upper wall 510 is on an upper side with respect to the optical axis direction z, and has an opening 511 and a pair of fitting grooves 512. The fitting grooves 512 are along two sides of the opening 511, which are the sides opposing to each other in the width direction y, and the grooves 512 extend in the longitudinal direction x. As shown in FIG. 2 and FIG. 6, the fitting grooves 512 are fitted by two sides of the sensor substrate 460 of the motion sensor unit 400, which are the sides opposing to each other in the width direction y. Thus, the motion sensor unit 400 is supported by the sensor base 500. The opening 511 provides a space for the metal cup 450, the transmissive cup 430 and the light shielding tube 440 to be erected upward from the sensor substrate 460 in the optical axis direction z.

The separation wall 520 is below the upper wall 510 with respect to the optical axis direction z, being spaced from the upper wall 510. As shown in FIG. 2, the cables 470 of the motion sensor unit 400 are housed in a space between the upper wall 510 and the separation wall 520. The leg walls 530 are separated from each other in the width direction y, and connected with each other by the upper wall 510 and the separation wall 520. The leg walls 530 are attached onto inward-extending projections formed in the translucent cover 600.

The heat dissipator 700, which conducts heat from the LED modules 300 to the outside, is made of aluminum for example, in the present embodiment. The heat dissipator 700 has a generally U shaped section, and extends long in the longitudinal direction x. The LED substrate 200 is mounted on an upper surface of the heat dissipator 700. The heat dissipator 700 has a power source storage 710. The power source storage 710 houses the power unit 800.

The power unit 800 converts, e.g. a commercial supply of 100 VAC, into DC power suitable for operating the LED modules 300 (LED chips 310), and includes a transformer, capacitors, resisters, and an LED driver (none of these are illustrated) for example. The power unit 800 in the present embodiment includes a circuit which turns on the LED module 300 (LED chips 310) for a predetermined time in response to an input of a detection signal from the motion sensor unit 400.

Each of the caps 850 is attached to one of the ends of the translucent cover 600 in the longitudinal direction x. The caps 850 serve as connection plugs for attaching the LED lamp 101 to a light fixture for straight tube fluorescent lamps. Each cap 850 has a case 860 and terminals 870. The case 860 is a bottomed cylinder made of metal or resin for example. The terminals 870 are metal pin members. In cases where the case 860 is made of metal, the terminals 870 are partially wrapped with an insulation material (not illustrated). As shown in FIG. 3, the case 860 of the cap 850 which is closer to the motion sensor unit 400 has a shielding projection 861. The shielding projection 861 is projected in the longitudinal direction x, and has a shape and a size for covering a region including part of the cutout 610 in the translucent cover 600 which is not covered by the motion sensor unit 400 and the shield plate 620.

Next, advantages of the LED lamp 101 will be described.

According to the present embodiment, any light such as infrared rays and visible light other than travelling to the condensing lens 420 is mostly blocked by the light shielding tube 440. The arrangement is thus capable of reducing cases where light from the LED modules 300 finds a way to the light receiving element 410. Therefore, the arrangement makes it possible to prevent the LED lamp 101 from being erroneously turned on when the user is not within the area to be lit by the LED lamp 101.

The light shielding tube 440 covers the tubular portion 431 of the transmissive cup 430 over the region from the sensor substrate 460 to the translucent cover 600, with its tip portion in the optical axis direction z exposed from the translucent cover 600. The arrangement prevents cases where light from the LED modules 300 reflected in the inside space of the translucent cover 600 eventually finds a way to the light receiving element 410, as well as cases where light which travels through the translucent cover 600 finds a way to the light receiving element 410. The arrangement is suitable for preventing unintended activation of the LED lamp 101. By placing the light receiving element 410 within the metal cup 450, the light shielding capability is further increased.

The ribs 441 of the light shielding tube 440 are made to contact with the inner surface of the translucent cover 600. This provides a structure that the light shielding tube 440 is sandwiched by the sensor substrate 460 and the translucent cover 600. The arrangement reduces cases where the light shielding tube 440 is displaced unduly. By forming the four ribs 441 which are spaced radially by 90 degrees, these ribs 441 and the translucent cover 600 are reliably made in contact with each other.

The translucent cover 600 has the cutout 610. This arrangement allows that the condensing lens 420 of the motion sensor unit 400 can be exposed appropriately. The shield plate 620 reduces undesirable cases where light escapes from a gap between the motion sensor unit 400 and the translucent cover 600. The case 860 in the cap 850 has the shielding projection 861, which helps ensure that light will not escape from the gap.

The motion sensor unit 400 is supported by the transparent sensor base 500. This arrangement allows that the sensor base 500 is above and across the LED module 300 while avoiding the problem that light from the LED modules 300 are blocked by the sensor base 500. The arrangement allows the LED modules 300 to be disposed without avoiding the sensor base 500, so the LED substrate 200 can be used as a common part in other LED lamps which do not include the motion sensor unit 400.

The cables 470 are disposed between the upper wall 510 and the separation wall 520 of the sensor base 500. The arrangement prevents cases where the cables 470 make undesirable contact with wiring patterns (not illustrated) of the LED module 300 and of the LED substrate 200.

FIG. 12 through FIG. 15 show another embodiment of the present invention. In these figures, elements identical with or similar to those in the previous embodiment are indicated by the same reference codes as in the previous embodiment.

Figure 12:
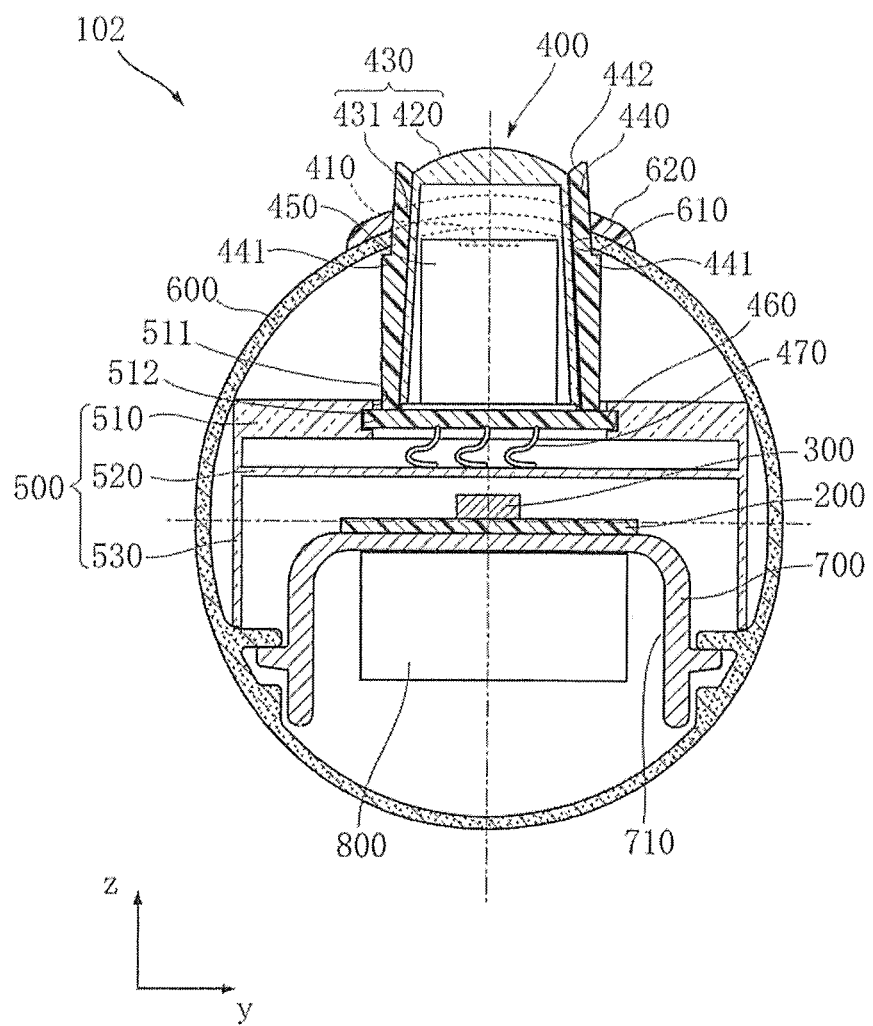
FIG. 12 is a sectional view of an LED lamp according to a second embodiment of the present invention.

FIG. 12 shows an LED lamp according to a second embodiment of the present invention. The present embodiment provides an LED lamp 102, which differs from the LED lamp 101 in the arrangement for the light shielding tube 440 of the motion sensor unit 400. In the present embodiment, a sloped surface 442 is formed on an upper end with reference to the optical axis direction z, of the light shielding tube 440. The sloped surface 442 is open upward with reference to the optical axis direction z. The sloped surface 442 has its outer edge located at a higher level than the lower edge of the condensing lens 420 with respect to the optical axis direction z. The sloped surface 442 has its lower edge aligned with the lower edge of the condensing lens 420 with respect to the optical axis direction z. Such an arrangement as the above is also capable of reducing the cases where unwanted light will hit the light receiving element 410, and therefore capable of preventing unintended actuation of the LED lamp 102.

Figure 13:
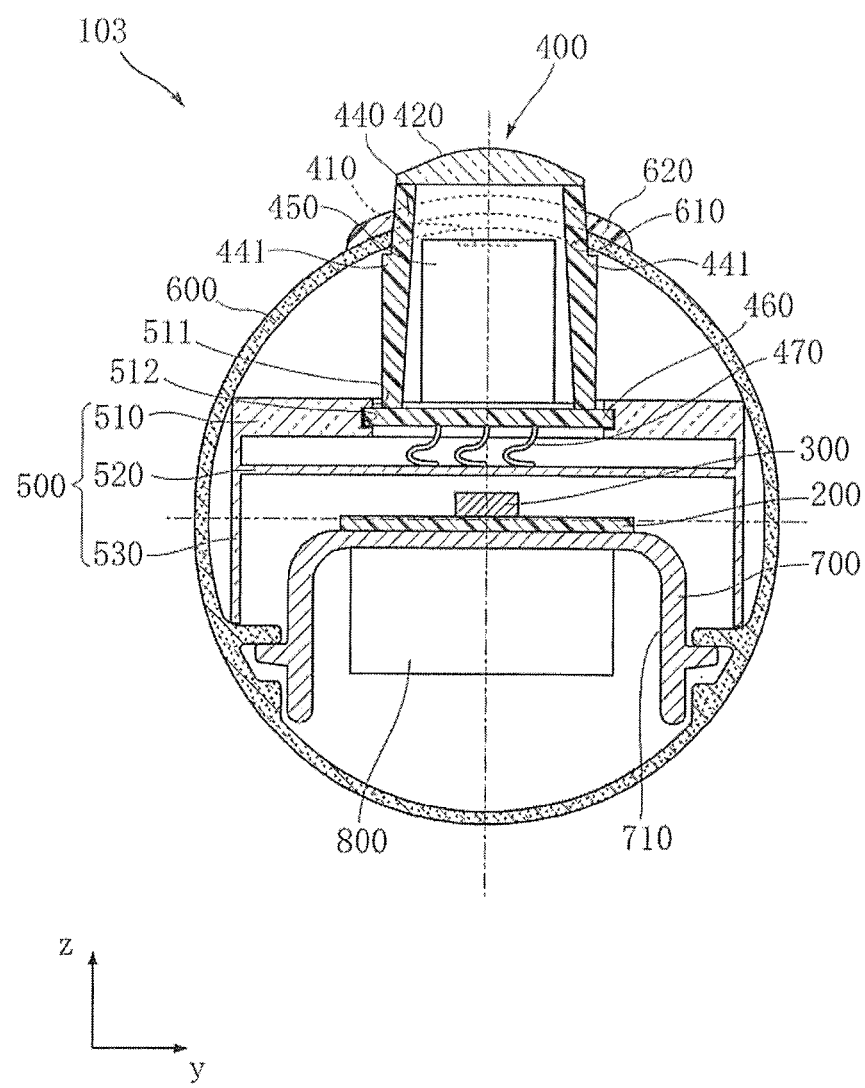
FIG. 13 is a sectional view of an LED lamp according to a third embodiment of the present invention.

FIG. 13 shows an LED lamp according to a third embodiment of the present invention. The present embodiment provides an LED lamp 103, which differs from the LED lamps 101, 102 in the arrangement for the motion sensor unit 400. In the present embodiment, the light shielding tube 440 is bonded to the condensing lens 420, differing from the previous embodiments which include the transmissive cup 430. Such an arrangement as the above is also capable of reducing the cases where unwanted light will hit the light receiving element 410, and therefore capable of preventing unintended actuation of the LED lamp 103.

Figure 14:
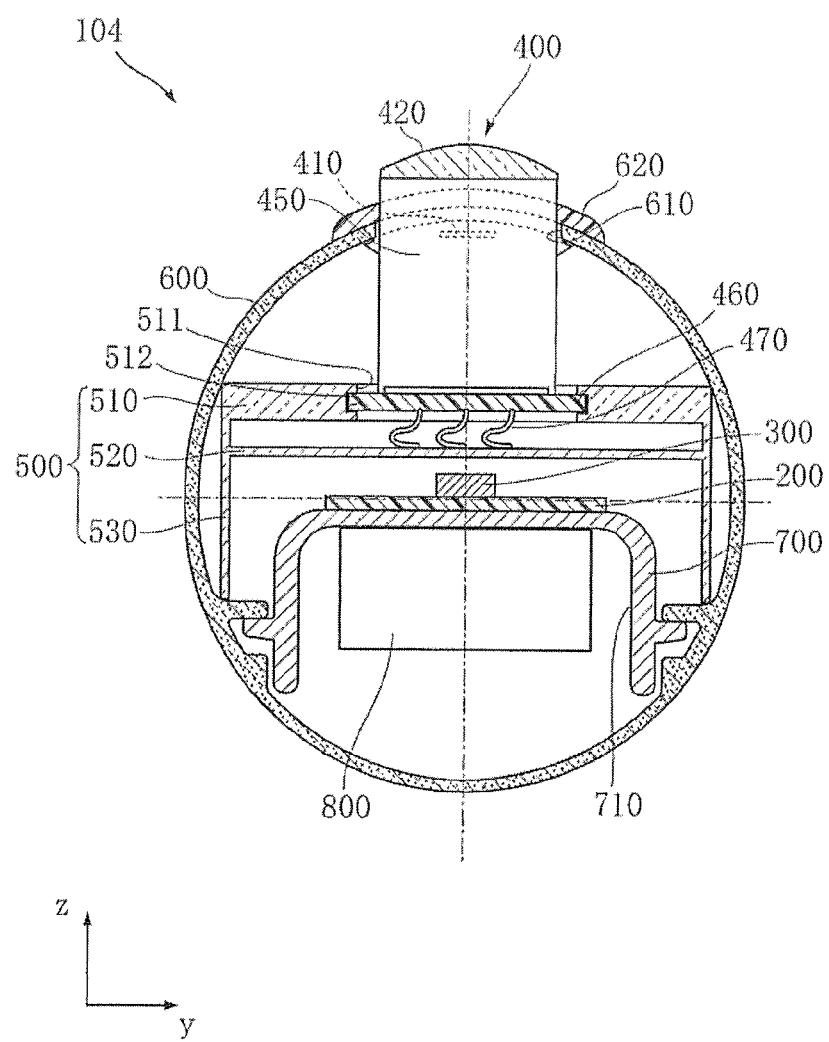
FIG. 14 is a sectional view of an LED lamp according to a fourth embodiment of the present invention.

FIG. 14 shows an LED lamp according to a fourth embodiment of the present invention. The present embodiment provides an LED lamp 104, which differs from the LED lamps 101, 102, 103 in the arrangement for the motion sensor unit 400. In the present embodiment, the condensing lens 420 is attached to an upper end of the metal cup 450 with respect to the optical axis direction z, and the embodiment does not include the transmissive cup 430 or the light shielding tube 440. The light receiving element 410 has an open upper end with respect to the optical axis direction z, and the upper end is slightly lower than the upper end of the metal cup 450 with respect to the optical axis direction z. In the present embodiment, the metal cup 450 represents the light shielding member according to the present invention. Such an arrangement as the above is also capable of reducing the cases where unwanted light will hit the light receiving element 410, and therefore capable of preventing unintended actuation of the LED lamp 104.

Figure 15:
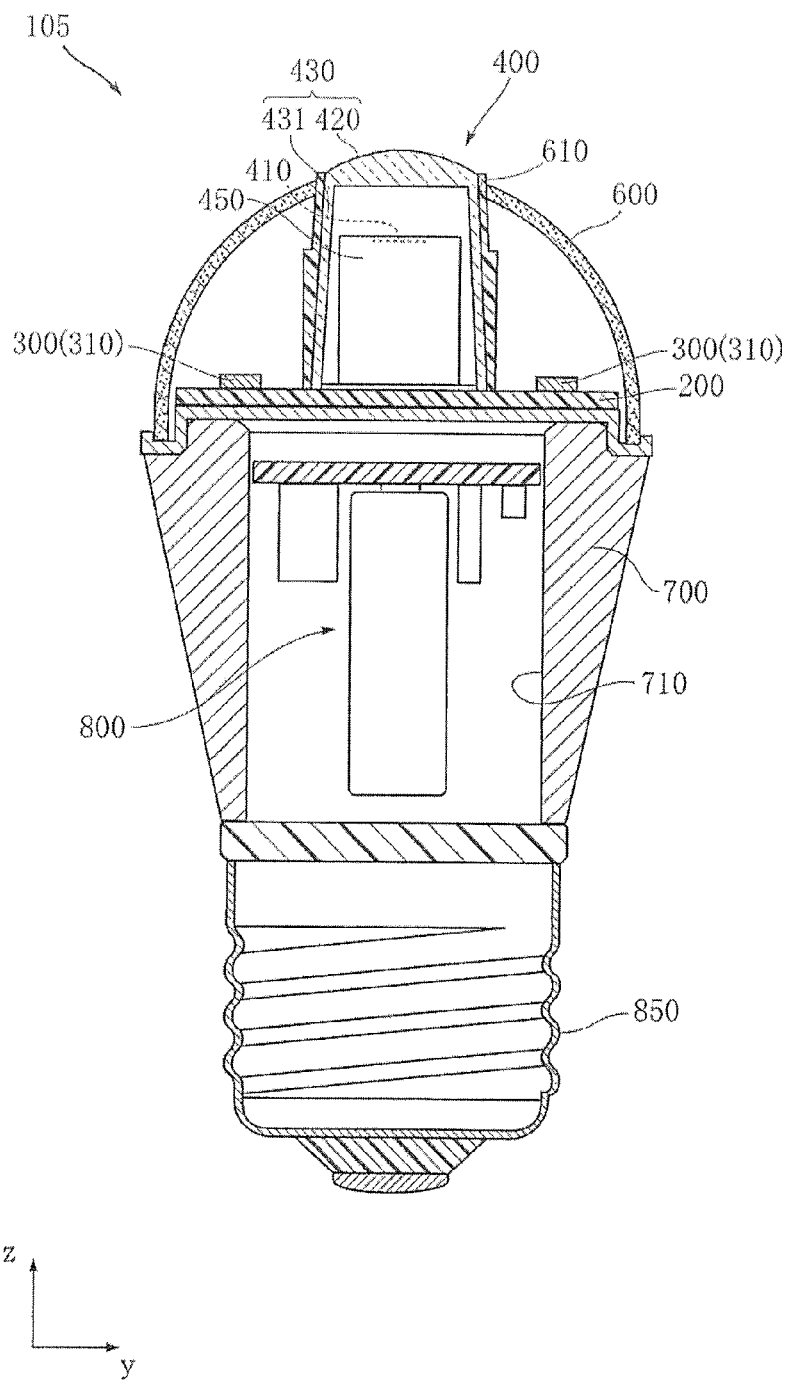
FIG. 15 is a sectional view of an LED lamp according to a fifth embodiment of the present invention.
Figure 16:
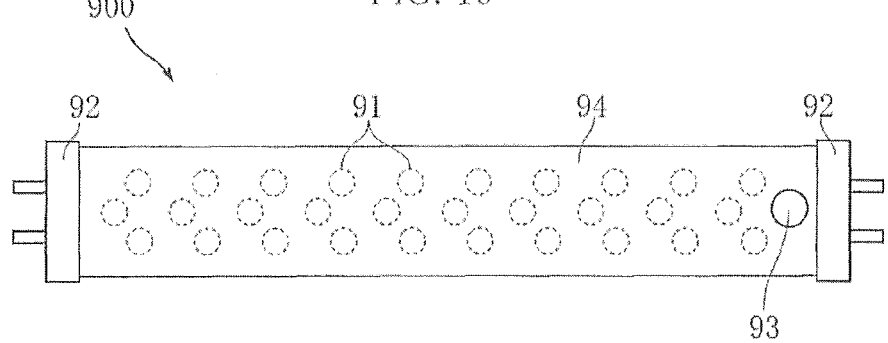
FIG. 16 is a plan view of a conventional LED lamp.

FIG. 15 shows an LED lamp according to a fifth embodiment of the present invention. The LED lamp 105 according to the present embodiment is an alternative to a traditional incandescent bulb, and includes an LED substrate 200, a plurality of LED modules 300, a motion sensor unit 400, a translucent cover 600, a heat dissipator 700, a power unit 800 and a cap 850.

The LED substrate 200 is circular, and the LED modules 300 are disposed annularly. The motion sensor unit 400 is identical with the one used in the LED lamp 101. However, any one of the motion sensor units 400 used in the LED lamp 102 through 104 may be employed instead. The motion sensor unit 400 is disposed at a center of the LED substrate 200, and is surrounded by the LED modules 300.

The translucent cover 600 is dome shaped, with the top of the dome formed with a cutout 610. The cutout 610 exposes the condensing lens 420 of the motion sensor unit 400 and an upper end of the light shielding tube 440 with respect to the optical axis direction z.

The heat dissipator 700, which releases heat from the LED module 300 to the outside, supports the LED substrate 200 and the translucent cover 600. The heat dissipator 700 has its outer surface formed with a plurality of fins (not illustrated) for example. The heat dissipator 700 is formed with a power source storage 710. The power source storage 710 houses the power unit 800. The cap 850 is attached to the heat dissipator 700, on a lower side with respect to the optical axis direction z away from the translucent cover 600. The cap 850 confirms to JIS (Japanese Industrial Standard) E17 or E26 for example.

Such an arrangement as the above is also capable of reducing the cases where unwanted light will hit the light receiving element 410, and therefore capable of preventing unintended actuation of the LED lamp 105.

The LED lamp according to the present invention is not limited to the embodiments already described above. The LED lamp according to the present invention may be varied in many ways in any specific details.

For example, the tubular portion and/or the light shielding tube of the transmissive cup according to the present invention need not necessarily be cylindrical which has a circular section, but may be like a bottomed angular tube. The metal cup according to the present invention may be a bottomed tube having a rectangular section.

Any of the LED lamps described thus far may be used in light fixtures which will be described hereafter, as an element referred to as a plurality of light sources 18 or a combination of a plurality of LED light sources 31 and a touchless sensor 14.

Figure 17:
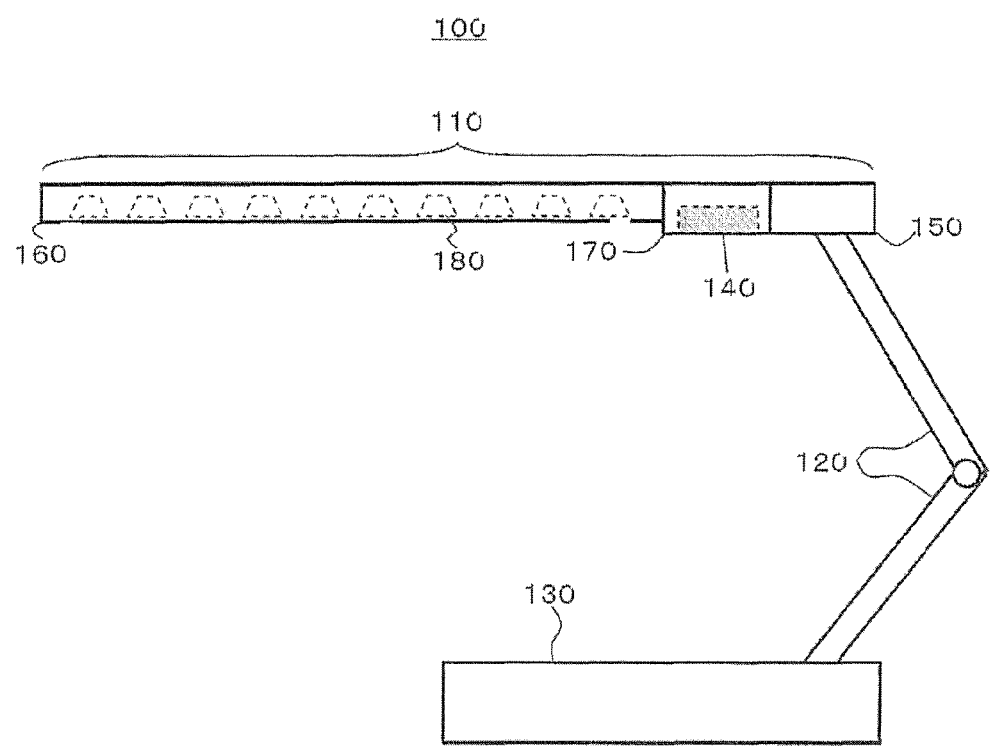
FIG. 17 shows an illuminator according to the present invention.

FIG. 17 shows a focal illuminator as one example of lighting apparatus according to the present invention. Generally, focal illuminators are known as lighting apparatus mainly used to provide practical lighting for a person doing a job or performing some activities. FIG. 17 shows a focal illuminator 10 which is designed to provide lighting at a desk or a table, and includes a case 11, an arm 12 and a base 13.

The case 11 has a light source holder 16, an operation section 17 and an arm bracket 15. The arm bracket 15 has an end supported by the arm 12. The case 11 is a component which also represent functional and/or design characteristics of the illuminator.

The arm 12 is a supporting member which connects the case 11 with the base 13, and is foldable to bring the light to any height. The base 13 is a part to be placed on a desk or a table, and to support the case 11 and the arm 12.

In the focal illuminator 10, it is preferable that a touchless sensor 14 is positioned near the arm bracket 15 where the arm 12 is attached. By doing so, the case 11 is protected from an excessive force even if the user's hand or finger makes accidental contact with the touchless sensor 14, and the arrangement will prevent the case 11 from being damaged or deformed by such incidents.

Hereinafter, description will be made for illuminators, by using the focal illuminator 10 as a specific example thereof. However, the present invention is not limited to the focal illuminator 10. The present invention is applicable to illuminators in general which include touchless sensors. Obviously, the present invention may be applied to those illuminators installed on a lower surface of a shelf board of a showcase or of a display rack for providing lighting to products displayed thereunder. The present invention may also be applied to kitchen illuminators, medical light equipment, and many other cases where non-contact activation is preferred due to hygienic reasons.

The light source holder 16 holds a plurality of light sources 18 disposed in, e.g. a single line pattern, on one of its main-surface side. The operation section 17 has a touchless sensor 14 on one of its main surface side. It should be noted here that LEDs are the best candidate for the light source 18 in view of power saving and long life.

In the focal illuminator 10, a human operator should simply bring his/her hand to near the operation section 17 to turn on/off the focal illuminator 10 without touching anything, since the touchless sensor 14 on one of the main surfaces of the operation section 17 performs all necessary operations.

The term near the operation section 17 means at a predetermined distance from the operation section 17. This distance is set in advance in a peripheral component of the touchless sensor 14 to be described later, and an appropriate value may be selected for the distance depending on the purpose for which the illuminator is used, the shape of the illuminator, the place where the illuminator is installed, the intensity of light from the illuminator, etc. This distance will be described later in more detail as a preset distance L.

Figure 18:
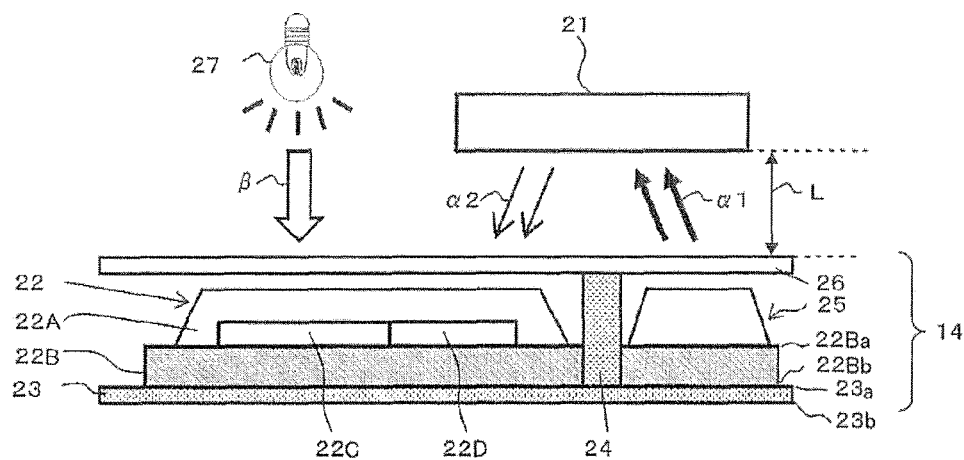
FIG. 18 is a conceptual drawing of a touchless sensor used in the illuminator according to the present invention.

FIG. 18 is a conceptual drawing of a touchless sensor used in the illuminator according to the present invention. The touchless sensor 14 works for detecting an object 21. The touchless sensor 14 includes a transparent plate 26, an infrared LED 25, a substrate 22B, a printed wiring substrate 23, a light shield spacer 24 and a semiconductor device 22. The touchless sensor 14 detects approach or movement of a detection target, i.e. the object 21, in a non-contact manner. The semiconductor device 22 incorporates a light intensity sensor 22C and a proximity sensor 22D. The light intensity sensor 22C is an optical sensor which detects the intensity of light from various sources of visible light such as fluorescent lamps, incandescent bulbs, the sun, etc. The proximity sensor 22D detects approach and/or position of an object in non-contact manner.

Although it is preferable that the light intensity sensor 22C and the proximity sensor 22D are disposed closely to each other for the sake of compactness of the semiconductor device 22, it is also imperative to pay consideration to an appropriate distance to separate the two from each other in order to ensure that both can operate appropriately without interfering with each other. The light intensity sensor 22C and the proximity sensor 22D are provided by photodiodes for example. The semiconductor device 22 and the infrared LED 25 are disposed on a main surface 22Ba side of the substrate 22B. The substrate 22B has another main surface 22Bb, which is in contact with a main surface 23a of the printed wiring substrate 23 except for an area occupied by the light shield spacer 24.

The printed wiring substrate 23 is made of glass epoxy resin for example and has another main surface 23b, which is attached to an inside of an unillustrated casing of the operation section 17 for example. The main surface 23a of the printed wiring substrate 23 is partially in contact with an end surface of the light shield spacer 24 whereas another end surface of the light shield spacer 24 is in contact with the transparent plate 26. Specifically, the printed wiring substrate 23 and the transparent plate 26 are separated by a predetermined distance of the height of the light shield spacer 24.

The semiconductor device 22 incorporates, in addition to the light intensity sensor 22C and the proximity sensor 22D, such components as a control circuit for processing various information detected by the sensors and an unillustrated data register capable of storing the processed information and reading the information as needed.

With reference to FIG. 18, an operation of the touchless sensor 14 will be outlined: The touchless sensor 14 emits infrared rays α1 of a predetermined intensity from the infrared LED 25 through the transparent plate 26. The infrared rays α1 hit an object 21, i.e. the detection target of the touchless sensor 14 and is reflected, and reflected infrared rays α2 come back to the semiconductor device 22 through the transparent plate 26. The object 21 is placed intentionally in order to reflect the infrared rays α1 and to make the reflected infrared rays travel to the touchless sensor 14. The object 21 is not an essential component for the illuminator. When the illuminator is in actual use, a hand of a human operator, for example, plays the part of the object 21 whereas when the function of the touchless sensor is evaluated in the production process of the illuminator, an inspection jig to be described later plays the part.

The semiconductor device 22 electrically detects the intensity of the reflected infrared rays α2 by means of the proximity sensor 22D, and performs a process to convert the detection result, i.e. light intensity information, into reflected-light intensity information for example. It should be noted here that the semiconductor device 22 incorporates an unillustrated reflected-light intensity information generator for the conversion of the light intensity information into the reflected-light intensity information. The resulting signal is stored in an unillustrated data register as e.g. reflected-light intensity information. The proximity sensor 22D incorporates an unillustrated infrared ray sensing section provided by a photodiode having a peak wavelength of e.g. 850 nm. It should be noted here that the light intensity sensor 22C is capable of measuring a light intensity of visible light β from a visible light source 27.

In general, the intensity of the reflected infrared rays α2, which come from the object 21 as a result of reflection, decreases as the distance increases if the detected infrared rays come from the same object. In other words, there is a correlation between the light intensity of the reflected infrared rays α2 and the distance from the light source, which is the infrared LED 25 placed inside the touchless sensor 14, to the object 21.

Actually, however, it is difficult to take each and all measurements to get the precise distance from the infrared LED 25 to the object 21 in the production process. Practically, therefore, it is more realistic to perform a set procedure on the distance between the object 21 and the transparent plate 26 by using a preset distance L, because the distance between the infrared LED 25 and the transparent plate 26 and the thickness of the transparent plate 26 are both sufficiently smaller than the preset distance L. The preset distance L is a distance selected with considerations on the purpose, the shape and so on of the touchless sensor 14 and the illuminator including it.

The semiconductor device 22 and an MCU (Micro Control Unit) which will be described later are capable of storing a threshold value for determining a distance to the object, for comparison with the reflected infrared rays α2 which are detected for the purpose of distance detection.

For example, this threshold value may be a value which indicates an intensity of the reflected infrared rays α2 when the touchless sensor 14 and the object 21 are spaced from each other by the preset distance L. This threshold value information may be used as a reference, and if a detection reveals that reflected infrared rays α2 have a light intensity equal to this threshold value, then it is possible to determine that the distance between the object 21 and the touchless sensor 14 is the preset distance L.

The preset distance L indicates the distance from the case 11 to an intended target of detection, i.e. the object 21. More specifically, it indicates the distance from the touchless sensor 14 to the object 21. In other words, the preset distance L indicates a distance by which the touchless sensor 14 and its peripheral components to be described later included in the focal illuminator 10 will determine that its detection target, i.e. the object 21, is at a predetermined range of distances.

The preset distance L is selected in consideration of the purpose of using the illuminator, the environment in which the illuminator is expected to be used, etc, and is a preset value ranging from 50 mm through 1000 mm for example. Thus, there may be a setting that the preset distance L=200 mm, for example. When the object 21 is closer, i.e. when the distance thereto is shorter than the preset distance L, the object 21 is detected by the touchless sensor 14 and its peripheral components to be described later.

In producing the focal illuminator 10 in FIG. 17, in particular the case 11, the light emission intensity, the light sensitivity, etc. tend to vary for components such as the infrared LED 25 and semiconductor device 22 of the touchless sensor 14 in FIG. 18. Also, in the course of assembling the touchless sensor 14, there may be some variation in positional accuracy, in steps such as the step of mounting the infrared LED 25 and the semiconductor device 22 onto the substrate 22B and then the printed wiring substrate 23, or the step of sealing the light intensity sensor 22C and the proximity sensor 22D with transparent resin 22A. The issue of positional accuracy is also present in the step of attaching the touchless sensor 14 to the operation section 17 inside the case 11.

Because of this positional variation, the focal illuminator 10 may not be able to detect accurately that an object is at the preset distance L, even if the production process has been conducted so that the above-described threshold value is permanently set to a light intensity value or a light intensity index value which indicates the intensity of the reflected infrared rays α2 from an object located at the preset distance L.

Figure 19:
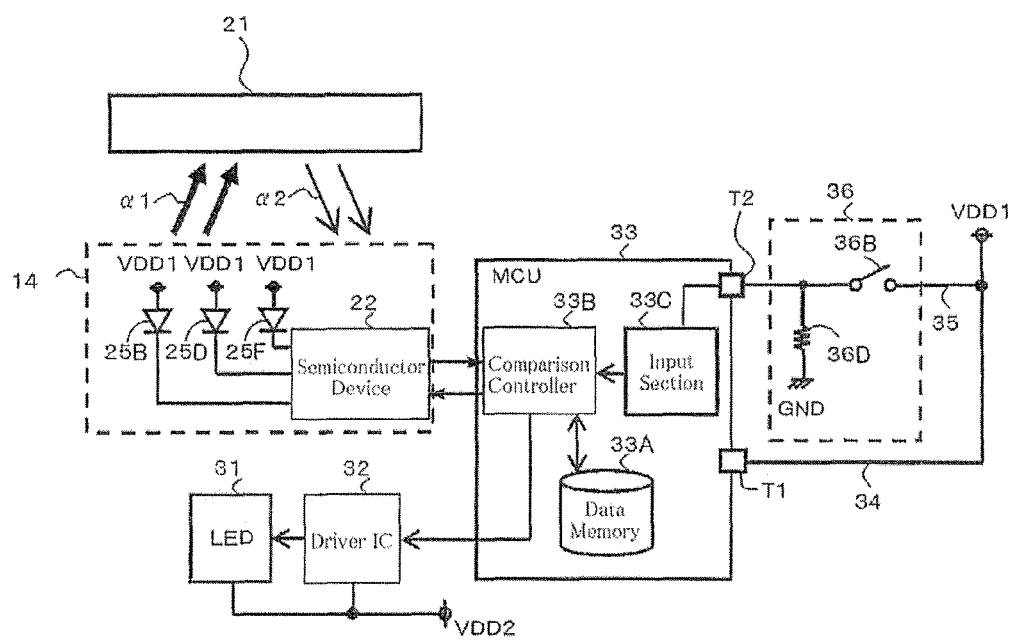
FIG. 19 is a block diagram of a circuit used in the illuminator according to the present invention.

FIG. 19 is a block diagram of a circuit used in the illuminator according to the present invention. The diagram specifically shows the touchless sensor 14 and its peripheral components. The focal illuminator 10 in FIG. 17 includes a circuit which is equivalent to the one in the circuit block diagram in FIG. 19.

FIG. 19 shows an illuminator which includes a LED light source 31 to serve as a light source of the illuminator; a semiconductor device 22 and infrared LEDs 25B, 25D and 25F each connected to the source voltage VDD1. The infrared LEDs 25B, 25D and 25F represent the infrared LED 25 in FIG. 18. It should be noted here that it is not mandatory to have all of these infrared LEDs. Having at least one is sufficient, having two is more preferable and having three is even more preferable. Having three of them helps achieving consistency primarily in terms of the area irradiated with infrared rays α1 and the intensity of the reflected infrared rays α2. The quantity may be decreased as far as the advantages of the present invention are not impaired. The arrangement described above has another advantage. Specifically, a plurality of infrared LEDs may be turned on sequentially to detect reflected light sequentially. Then for each piece of reflected-light intensity information, calculation is made to obtain a phase difference of each, for example. In this way, additional functions may be provided such as detecting movement of the object 21 and obtaining an axis of the movement.

The touchless sensor 14, which serves as a non-contact detector of approach and movement of the object 21, incorporates the semiconductor device 22; an MCU 33 which performs drive control on a driver IC 32 based on an output from the semiconductor device 22; and the driver IC 32 which performs drive control on the LED light source 31 in response to an output from the MCU 33. A source voltage VDD1 is set to 3.3 volts or 5 volts whereas a source voltage VDD2 is set to 24 volts for example.

The MCU 33 is supplied with the source voltage VDD1 via voltage supply wires 34 and a power terminal Tm1. Also, the MCU 33 is supplied with the source voltage VDD1 via voltage supply wires 35, enabling means 36 and a control terminal Tm2. The enabling means 36 is connected to an outside of the MCU 33, which represents the controller according to the present invention.

The MCU 33 can be provided by an 8-bit through 16-bit flash microcomputer for example.

The MCU 33 includes a data memory 33A, i.e. a component for storing the threshold value which is compared with the light intensity of the reflected infrared rays α2 to determine the distance, an ON/OFF state of the driver IC 32, and other data.

The MCU 33 sends e.g. a start signal to the semiconductor device 22. In response to the start signal, the semiconductor device 22 sends the intensity values of the reflected infrared rays α2 to the MCU 33 at a predetermined time interval, in the form of the reflected-light intensity information for example.

The MCU 33 includes a comparison controller 33B for making a comparison between the reflected-light intensity information received from the semiconductor device 22 and the above-mentioned threshold value stored in the data memory 33A for use in determining the distance. This threshold value represents a value of the reflected infrared rays α2 when the object 21, i.e. the detection target, is at the preset distance L, and the value is available in the form of e.g. the reflected-light intensity information.

The MCU 33 includes an input section 33C which, for example, outputs a high-level state signal when the control terminal Tm2 is supplied with the source voltage VDD1 while outputting a low-level state signal in response to an application of a grounding voltage, to the comparison controller 33B.

If the signal from the input section 33C is the low-level signal, the comparison controller 33B makes reference to the threshold value information stored in the data memory 33A, and compares the threshold value information with the reflected-light intensity information from the semiconductor device 22.

Further, if the reflected-light intensity information received from the semiconductor device 22 is greater than the threshold value stored in the data memory 33A, the comparison controller 33B sends a turn-on command when the illuminator is not on, or sends a turn-off command when the illuminator is on to the driver IC 32. Based on these commands, the driver IC 32 drives the LED light source 31. For example, PWM signal can be utilized as a drive signal for this purpose. Hereinafter, this state will be called normal mode.

The data memory 33A can store a data which indicates whether the driver IC 32 is in the ON state or in the OFF state. By making reference to this information, the comparison controller 33B sends an ON command when the fixture is in the OFF state while it sends an OFF command when the fixture is in the ON state to the driver IC 32, and the driver IC 32 drives the LED light source 31 based on the command. As has been described thus far, the touchless sensor 14 and the MCU 33 work together so that the illuminator according to the present invention can detect an object and drive the light source 18 in FIG. 17.

If the signal from the input section 33C is the high-level signal, the comparison controller 33B makes an access to the threshold value information stored in the data memory 33A, subtracts a predetermined value from the reflected-light intensity information, and then overwrites the threshold value with the result of the calculation. Hereinafter, this state will be called adjustment mode. In the adjustment mode, an adjustment is made to the distance determining threshold value which is a reference value stored in the MCU 33 to turn on or off the illuminator.

The enabling means 36 enables/disables the operation of the circuit which is incorporated in the MCU 33 for performing the adjustment mode. When the enabling means 36 enables the operation, the MCU 33 performs the adjustment mode whereas the MCU 33 performs the normal mode when the adjustment operation is disabled.

The enabling means 36 is constituted by a switch 36B and a resister 36D, for example. The switch 36B has two ends, one of which is connected with a voltage supply wire 35 whereas the other end is connected with an end of the resister 36D. The resister 36D has another end, which is connected with a grounding potential GND.

The switch 36B can be provided by a dip switch, tact switch, toggle switch, etc.

When the switch 36B is turned on, the source voltage VDD1 is supplied to the control terminal Tm2 of the MCU 33, which brings the MCU 33 in the enabled state. When the switch 36B is in the OFF state, the control terminal Tm2 is connected with the grounding potential GND via the resister 36D. This brings the MCU 33 in the disabled state so the adjustment mode is not performed. In other words, the MCU 33 is in the adjustment mode when the control terminal Tm2 is supplied with the source voltage VDD1, i.e. in the high-level state, whereas it is in the normal mode when the control terminal Tm2 is supplied with the grounding voltage, i.e. in the low-level state.

The enabling means 36, which is constituted by the switch 36B and the resister 36D, may be configured differently. For example, it may be implemented by some device which has a switching capability from high-level and low-level and vice versa. In fact, the enabling means 36 may be provided by whatsoever device as far as it is capable of informing the MCU 33 of two states and a change in the state from one to the other. Specifically for example, the enabling means 36 may be provided by a transistor.

Figure 20A:
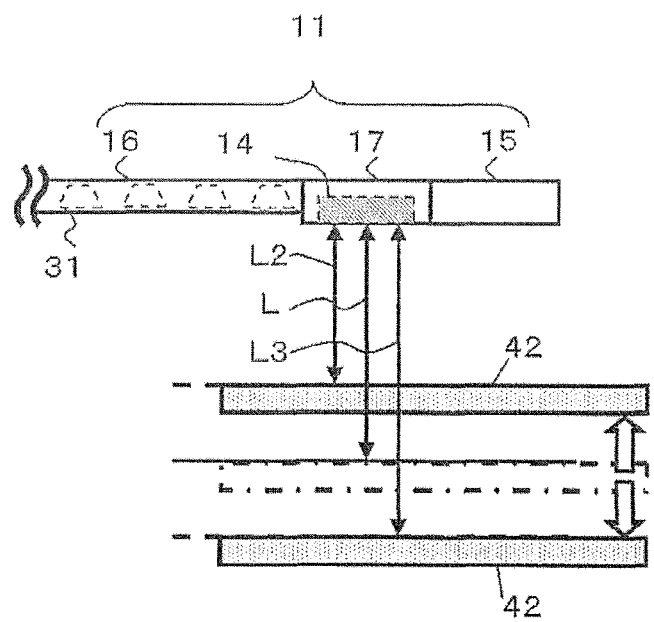
FIG. 20A is a conceptual drawing for describing a method for adjusting a distance determining threshold value which is stored in a controller in an illuminator according to the present invention.
Figure 20B:
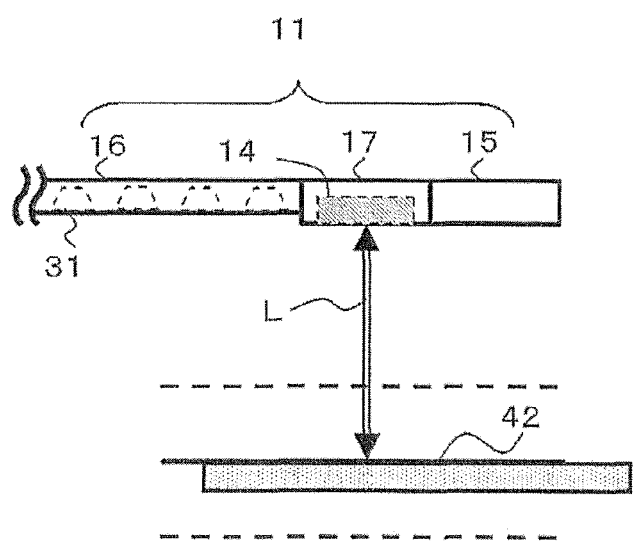
FIG. 20B is a conceptual drawing for describing a method for adjusting a distance determining threshold value which is stored in a controller in an illuminator according to the present invention.

FIG. 20A and FIG. 20B illustrate a method for adjusting the distance determining threshold value which is stored in the MCU 33 in an illuminator according to the present invention.

In order to describe the method, assume that in addition to a case 11 shown in FIG. 17, there is prepared an inspection jig 42 which is used in place of such a detection target as a hand of a human operator in an inspection procedure.

The case 11 is basically identical with the one shown in FIG. 17, and includes a light source holder 16, a operation section 17 and an arm bracket 15. The operation section 17 has a touchless sensor 14 at a predetermined location thereof. Also, the light source holder 16 has a plurality of LED light sources 31. The inspection jig 42 is placed as a detection target, in a direction in which the touchless sensor 14 emits infrared rays. Since the inspection jig 42 is an alternative to the object 21 shown in FIG. 18 and FIG. 19, it is capable of reflecting infrared rays.

FIG. 20A shows an initial state before the inspection is started, as well as a state in which the inspection is underway. In the initial state, the inspection jig 42 and the case 11 are separated by, e.g. the preset distance L. The preset distance L is, as already described, selected in consideration of the purpose of using the illuminator, the environment in which the illuminator is expected to be used, etc, and is a preset value ranging from 50 mm through 1000 mm for example. Thus, there may be a setting that the preset distance L=200 mm, for example. When the object is at a closer distance than the preset distance L, the touchless sensor 14 and the MCU 33 detect the object.

FIG. 20A shows an arrangement where the case 11 is fixed whereas the inspection jig 42 is movable. Needless to say, there may be an arrangement where the inspection jig 42 is fixed and the case 11 is moved to adjust the distance between the inspection jig 42 and the case 11.

The inspection jig 42 is made of a material which does not allow infrared rays to pass through nor absorb. Examples of the material includes non-transparent opaque white non-transparent or non-transparent white polyethylene terephthalate resin, thermosetting resin consisting of acrylic nitrile, acrylonitrilebutadiene and acrylonitrile styrene, i.e. ABS resin, polyacrylonitrile styrene resin, and wood. The only reason for using these is that they are good reflectors of infrared rays, so material is not limited to these and any material which is a good reflector of infrared rays may be employed.

Preferably, the inspection jig 42 is circular or rectangular, and has a thickness of about 10 mm. With this thickness, the jig reliably blocks infrared rays while providing sufficient strength as well for handling during the inspection procedures.

The inspection jig 42 has an upper surface area, which is predetermined to an optimum value depending upon the preset distance L shown in FIG. 20A, and an infrared ray irradiation angle which is a setting in the touchless sensor 14. More specifically, when a circular cone is assumed with the touchless sensor 14 at its top and the angle of the apex equal to the above-mentioned infrared ray irradiation angle, the circular cone has a bottom surface area at the preset distance L. The above-mentioned surface area of the jig should be greater than this bottom surface.

The infrared rays are emitted downward from the touchless sensor 14 at a predetermined irradiation angle. The infrared rays are emitted at this irradiation angle, in a pattern of, e.g. circular cone with the touchless sensor 14 at the apex of the cone.

In this adjustment method according to the present invention, a tolerance range is set to the preset distance L which is the distance at which the illuminator is activated. The tolerance is set to 1% through 30% of the preset distance L for example. Depending on the intended application of the illuminator, the tolerance may be set to 5% through 10% of the preset distance L. Further, a tolerable longest distance L3 is defined as a distance which is obtained by adding the above-mentioned tolerance to the preset distance whereas a tolerable shortest distance L2 is defined as a distance which is obtained by subtracting the above-mentioned tolerance from the present distance.

It should be noted here that the adjustment method according to the present invention eventually adjusts the distance determining threshold value which is stored in the MCU 33. However, as shown in FIG. 20A, in the actual adjustment procedure, first, the illuminator is moved over a distance range defined by the tolerable shortest distance L2 and the tolerable longest distance L3 or moved beyond this range, to determine whether the illuminators are non-defective or they need adjustment.

FIG. 20B shows a state where the illuminator, which was inspected and determined in the step shown in FIG. 20A that adjustment was necessary, has been adjusted so that the actual distance between its touchless sensor 14 and the inspection jig 42 is the preset distance L. The distance between the two can be fixed at the preset distance L by using an unillustrated adjustment jig. The adjustment jig may be provided by a scale which indicates distance, or an adjustment jig which has the exact length of the preset distance L.

As shown in FIG. 20B, the two is spaced from each other by the preset distance L, then light intensity is measured under this condition, and the measured light intensity is stored in the MCU 33.

Figure 4:
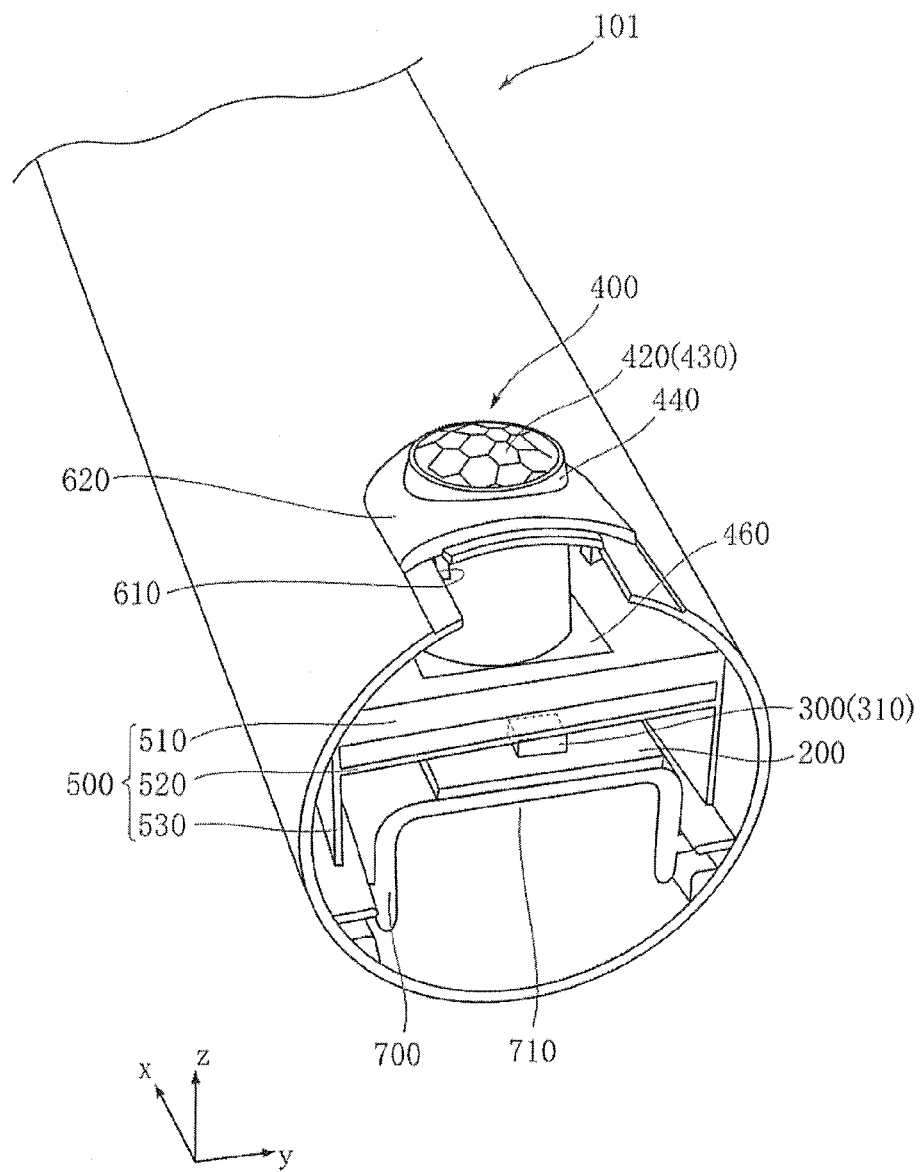
FIG. 4 is a perspective view of a primary portion of the LED lamp in FIG. 1.
Figure 21:
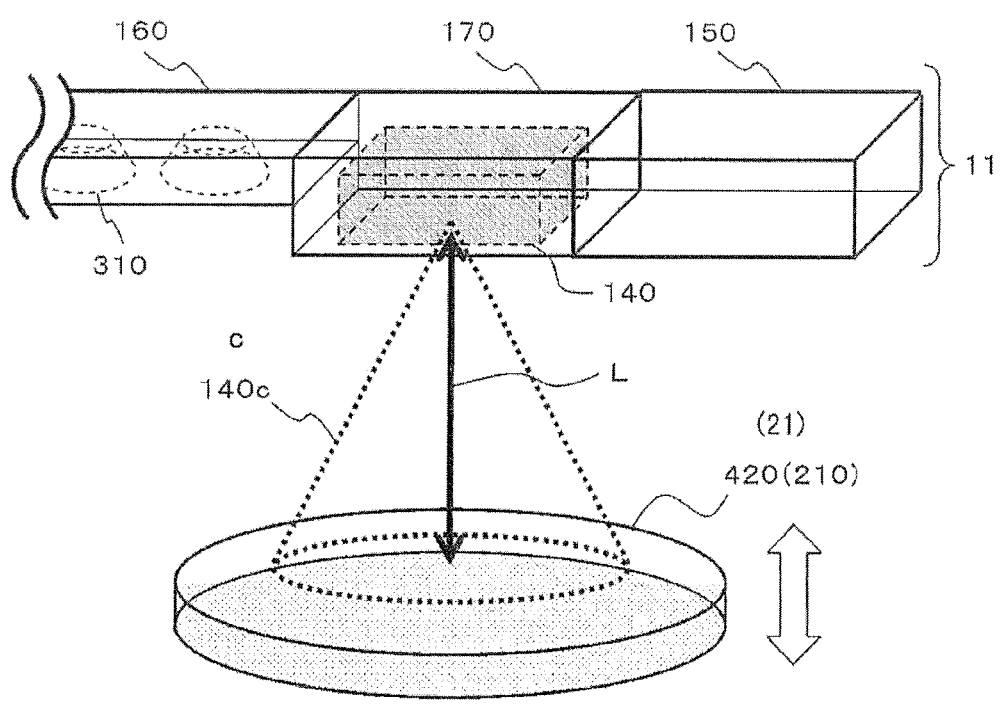
FIG. 21 is a conceptual drawing to show how light is emitted from a touchless sensor according to the present invention toward an inspection jig.

FIG. 21 is a conceptual drawing to show a state where infrared rays α1 are emitted from the touchless sensor 14 toward the inspection jig 42. Parts and components already shown in FIG. 4 are indicated by the same reference codes. The infrared rays α1 are emitted at a predetermined irradiation angle. The infrared rays α1 are emitted to the inspection jig 42 (the object 21), in a shape of e.g. a circular cone with the center of the touchless sensor 14 being the apex of the cone, to cover a predetermined detection range 14c.

Figure 22:
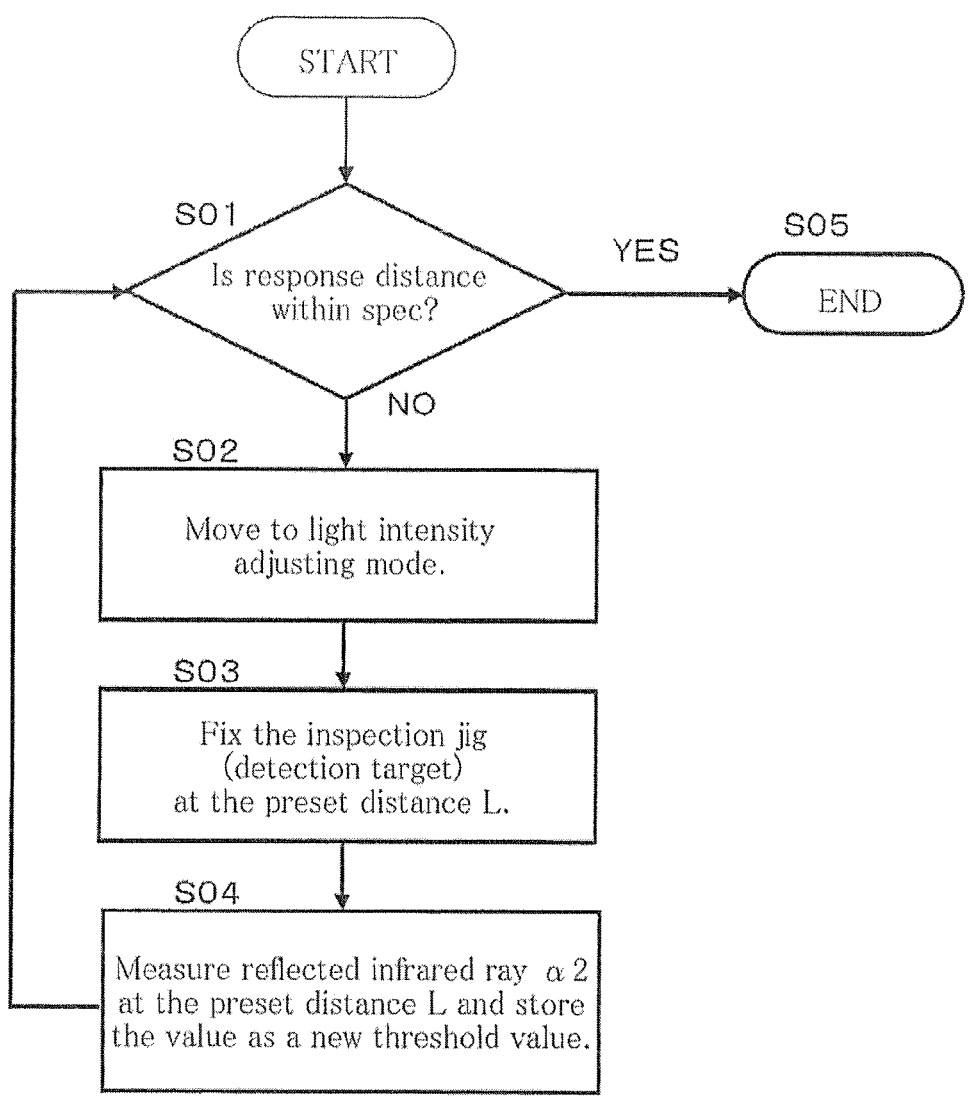
FIG. 22 is a flowchart of a method for adjusting a distance determining threshold value which is stored in a controller in an illuminator according to the present invention.

FIG. 22 is a flowchart for adjusting the distance determining threshold value which is in storage in the MCU 33. The adjustment to the light intensity value for storage is performed under the states as shown in FIG. 20A and FIG. 20B.

Step S01 checks a distance, so called response distance, at which the touchless sensor 14 and the MCU 33 actually detect the presence of the inspection jig 42. As mentioned above, the response distance must fall within the range between the tolerable shortest distance L2 and the tolerable longest distance L3 as shown in FIG. 20A in order for the product to pass the inspection. If the inspection jig 42 is at a closer distance than the response distance, the touchless sensor 14 and the MCU 33 always detect the inspection jig 42. It should be noted here that in the actual inspection, a range slightly wider than from the tolerable shortest distance L2 to the tolerable longest distance L3 should be set.

In Step S01, the inspection jig 42 can be moved freely within or beyond the range defined by the tolerable shortest distance L2 and the tolerable longest distance L3.

In Step S01, a measurement is performed for an actual distance $L_R$ between the touchless sensor 14 and the inspection jig 42 when the touchless sensor 14 and the MCU detect the inspection jig 42 and the illuminator was activated, i.e., turned on or off. This measurement may be made using an external unillustrated measuring apparatus.

If Step S01 determines that the product is non-defective, the process skips Steps S02 through S04, goes to Step S05 and the adjustment flow comes to an end.

If the product is determined to be detective on the other hand, the process goes to Step S02.

In Step S02, the switch 36B shown in FIG. 19 is turned on, whereby the MCU 33 is brought into the adjustment mode. In this transition mode, the distance determining threshold value which is stored in the MCU 33 is adjustable. The illuminator is turned on/off in accordance with the light intensity value stored in the MCU 33.

In Step S03, an actual distance between the touchless sensor 14 and the inspection jig 42 is brought to be substantially the same as the preset distance L. As has been described, the preset distance L is selected in consideration of the purpose of using the illuminator, the environment in which the illuminator is expected to be used, etc, and is a preset value ranging from 50 mm through 1000 mm for example. Thus, there may be a setting that the preset distance L=200 mm, for example, and this value is one of specifications of the illuminator according to the present invention.

Step S04 measures a light intensity of the reflected infrared rays α2 when the actual distance $L_R$ is equal to the preset distance L, i.e. when $L_R$=L. The light intensity value of the reflected infrared rays α2 is processed by the semiconductor device 22 and sent to the MCU 33. Then, the comparison controller 33B processes the value and thereafter the value is stored in the data memory 33A as a new distance determining threshold value.

When Step S04 is completed, the process returns to Step S01. By repeating the above-described steps in the adjustment flow, it becomes possible to reliably activate the illuminator within a tolerable range of the preset distance L.

Once the adjustment mode shown in FIG. 22 is finished, the switch 36B in FIG. 19 is turned off, and the product undergoes subsequent steps such as optical measurement, packaging and shipment, etc.

Figures 23, 24A:
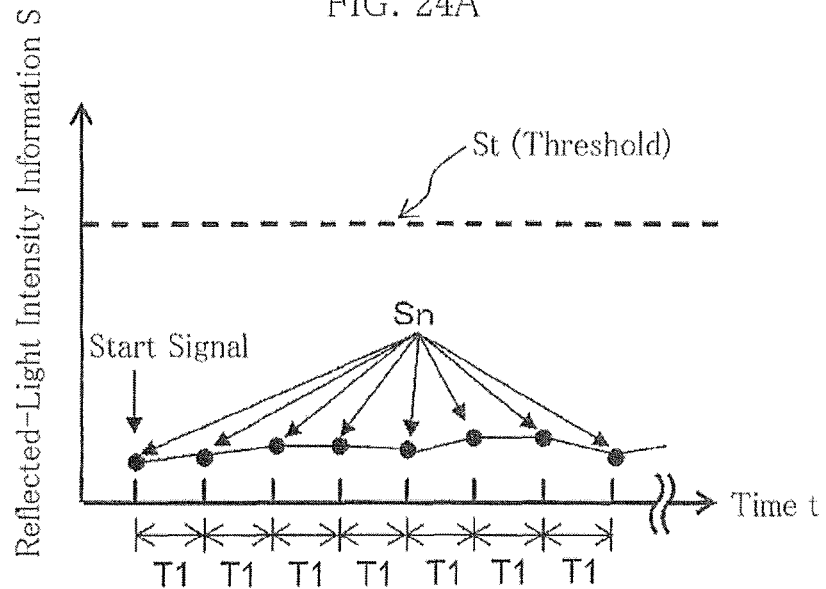
FIG. 23 shows a pass/fail decision table used in the adjusting method in FIG. 22.
FIG. 24A shows a time chart for describing a signal which is processed in a controller in a normal mode according to the present invention.

FIG. 23 shows a pass/fail decision table used in the adjustment method in FIG. 22. In FIG. 23, a reference symbol "○" means that the product is non-defective and therefore there is no need to perform the adjustment shown in FIG. 22. A triangle reference symbol "Δ" means that the product must undergo the adjustment process in FIG. 22. A reference symbol "×" means that the product is defective as the illuminator. These rejects are principally found and removed before the adjustment procedure in FIG. 22 is executed, but these examples are shown purposefully in FIG. 23 for the sake of reference.

FIG. 23 shows eight samples, i.e. case 1 through case 8, as hypothetical examples. The adjustment procedure in FIG. 22 will be applied to two of the cases, i.e. Case 2 and Case 3 as has been described earlier. FIG. 23 shows three conditional states, (A), (B) and (C) for each case, about the actual distance $L_R$ between the inspection jig 42 and the touchless sensor 14. State (A) is a state where there is a relationship of $L_R$<L2. Specifically, this is the state where distance $L_R$ between the inspection jig 42 and the touchless sensor 14 is shorter than the tolerable shortest distance L2, i.e., the inspection jig 42 is closer the touchless sensor 14 than designed.

State (B) is a state where L2≤$L_R$≤L3. Specifically, this is a state where the actual distance $L_R$ between the inspection jig 42 and the touchless sensor 14 is between the tolerable shortest distance L2 and the tolerable longest distance L3.

State (C) is a state where $L_R$>L3. Specifically, this is the state where the actual distance $L_R$ between the inspection jig 42 and the touchless sensor 14 is longer than the tolerable longest distance L3, i.e., the inspection jig 42 is farther from the touchless sensor 14 than designed. It should be noted here that when the inspection jig 42 and the touchless sensor 14 are away from each other than the tolerable longest distance L3 the touchless sensor 14 should not be activated in a non-defective illuminator.

Upon detection by the touchless sensor 14 and a subsequent response by the MCU 33, an ON command is sent when the fixture is in the OFF state while an OFF command is sent when the fixture is in the ON state, to the driver IC 32 in FIG. 19, and the driver IC 32 drives the LED light source 31 based on the command. The LED light source 31 is driven by a PWM signal for example. If the LED light source 31 located inside the assembled case 11 responded by turning on the light when the light was in the OFF state or by turning OFF the light when the light was in the ON state during the inspection, a High Level (Hv) mark is given whereas if there was no response, a Low Level (Lv) mark is given.

Referring to FIG. 23, Case 1 is determined as normal, i.e. the product is determined non-defective, in the inspection. In States (A) and (B) the LED light source 31 showed High Level (Hv). In State (A) where the distance $L_R$ between the inspection jig 42 and the touchless sensor 14 was not longer than the tolerable longest distance L3, the touchless sensor 14 made detection as designed and the MCU 33 responded subsequently. When, however, the distance $L_R$ between the two exceeded the tolerable longest distance L3, the touchless sensor 14 did not make detection and the MCU 33 did not respond, so the result was Low Level (Lv). An illuminator behaving in such a characteristic is a non-defective product. Since the illuminator in Case 1 does not need to undergo the adjustment procedure in FIG. 22, it is determined that the touchless sensor 14 has a correct range of sensing for the MCU 33. Therefore, Steps S02 through S04 are skipped in Case 1, and the process will be brought to an end at Step S05.

In Case 2, the touchless sensor 14 and the MCU 33 both outputted High Level (Hv) in States (A) and (B) like in Case 1, so this product is non-defective. However, the product also outputted High Level (Hv) in State (C). Specifically, even when the distance $L_R$ between the inspection jig 42 and the touchless sensor 14 was longer than the predetermined distance, the touchless sensor 14 was sensitive enough to detect the inspection jig 42. Thus, the product was judged that it should undergo the adjustment procedure. In other words, Case 2 is a case where the touchless sensor 14 is more sensitive, being capable of detecting beyond the predetermined range. In other words, the touchless sensor 14 does not function within the predetermined normal range.

In Case 3, the touchless sensor 14 and the MCU 33 were both outputted High Level in States (A) and (B) like in Case 1, so this product is non-defective. However, the touchless sensor 14 and the MCU 33 did not function in State (B) which is the range in which they are designed to function, and their output for this State was Low Level (Lv). The touchless sensor 14 in such an illuminator is not sensitive enough in contrast to Case 2. Therefore, the same judgment as in Case 2 is given, i.e. that the touchless sensor 14 and the MCU 33 do not function within the predetermined normal range, and so they must undergo the adjustment procedure according to the present invention.

As has been mentioned, FIG. 23 shows other possible combinations of the states, as Cases 4 through 8 in addition to Case 1, Case 2 and Case 3. However, these defective products will not undergo the adjustment procedure described thus far since they will have been removed in previous steps such as sensor inspection step. Therefore, there is no need to consider these products in the present adjustment procedure.

FIG. 24A through FIG. 24C, FIG. 25A and FIG. 25B are time charts for describing signals which are processed inside the MCU 33 when the MCU 33 is in the normal mode and in the adjustment mode according to the present invention. In each figure, the horizontal axis represents time (t) whereas the vertical axis represents the reflected-light intensity information S. Each figure plots reflected-light intensity information S which represents reflected infrared rays α2 received by the MCU 33 from the semiconductor device 22 at each time point.

It should be noted here that in FIG. 24A through FIG. 24C, FIG. 25A and FIG. 25B, a reference symbol (●) indicates that there is no detection target or that the detection target is far enough from the touchless sensor 14 in comparison with the preset distance L. A reference symbol (■) indicates that the detection target is present, and the distance between the touchless sensor 14 and the detection target is the preset distance L, i.e. $L_R$=L. Also, in each figure, a broken line represents a distance determining threshold value St which is stored in the data memory 33A for use by the comparison controller 33B in comparison with the above-described reflected-light intensity information received.

FIG. 24A shows a case where there is no such object as shown in FIG. 18 or FIG. 19, or there is no detection target such as the inspection jig 42 shown in FIG. 20A or FIG. 20B, or a case where such an object or target is far away by a distance longer than the preset distance L. Each figure illustrates that once the MCU 33 sends a start signal, the semiconductor device 22 sends information about the reflected infrared rays α2 in the form of the reflected-light intensity information Sn, at a predetermined time interval T1, i.e. on a periodic basis. Inside the MCU 33, the comparison controller 33B compares the received reflected-light intensity information Sn with the threshold value St which is stored in the data memory 33A. When there is no detection target in the direction in which the touchless sensor 14 works, or when a detection target is far away by a greater distance than the preset distance L, the reflected-light intensity information Sn at each time point is always lower than the threshold value St.

Now, referring to FIG. 24B, description will cover how the MCU 33 works by comparing the threshold value St with the received reflected-light intensity information Sn. It should be noted here that if a product works as described herein, the product is non-defective. Preferably, the threshold value St is set as a value which is obtained by subtracting a predetermined marginal value from the reflected-light intensity information which is a value to be detected when a detection target is at the preset distance L. Now, if a detection target is at the preset distance L at time point Ta, detected reflected-light intensity information Sta is greater than the threshold value St. Then, it is necessary to determine which of the commands, ON command or OFF command, should be sent to the driver IC. This can be made, for example, by using the comparison controller 33B to compare reflected-light intensity information St1 obtained at Time Point Ta−1 which is a time point immediately before Time Point Ta with the subsequent reflected-light intensity information Sta obtained at Time Point Ta, to determine if there was an increase in the reflected-light intensity information S across the threshold value St as indicated by a reference symbol X1, between Time Point Ta−1 and Time Point Ta. This enables the touchless sensor 14 and the subsequent MCU 33 to detect the detection target at the preset distance L and to respond to the detection.

FIG. 24C shows a case where adjustment must be made to the illuminator. FIG. 24C represents Case 3 in FIG. 23 for example. FIG. 24C shows a case where a detection target is at the preset distance L at Time Point Ta, yet reflected-light intensity information Sn which is actually sent to the MCU 33 is smaller than the threshold value St, and therefore the MCU 33 cannot recognize that the detection target is at the preset distance L, being unable to respond to the presence of the target.

Figure 25A:
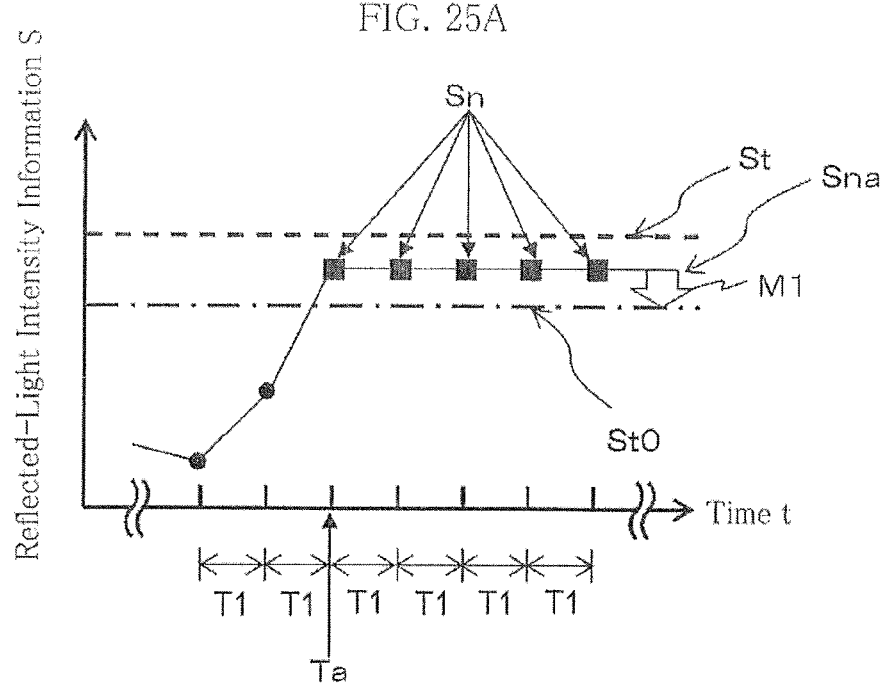
FIG. 25A shows a time chart for describing a signal which is processed in a controller in an adjustment mode according to the present invention.

FIG. 25A shows time-course change of the reflected-light intensity information Sn processed by the MCU 33 in the present adjusting method. Signals after Time Point Ta indicate that the inspection jig 42 is at the preset distance L, which represents the situation described in Step S03 and FIG. 20B. During the adjustment mode, the comparison controller 33B preferably stores an average value Sna of reflected-light intensity information Sn received during a predetermined time period as a new threshold value St0 in the data memory 33A. Preferably, the new threshold value St0 is obtained by subtracting a predetermined marginal value M1 from the average value Sna. This subtraction is performed by the comparison controller 33B.

Figure 25B:
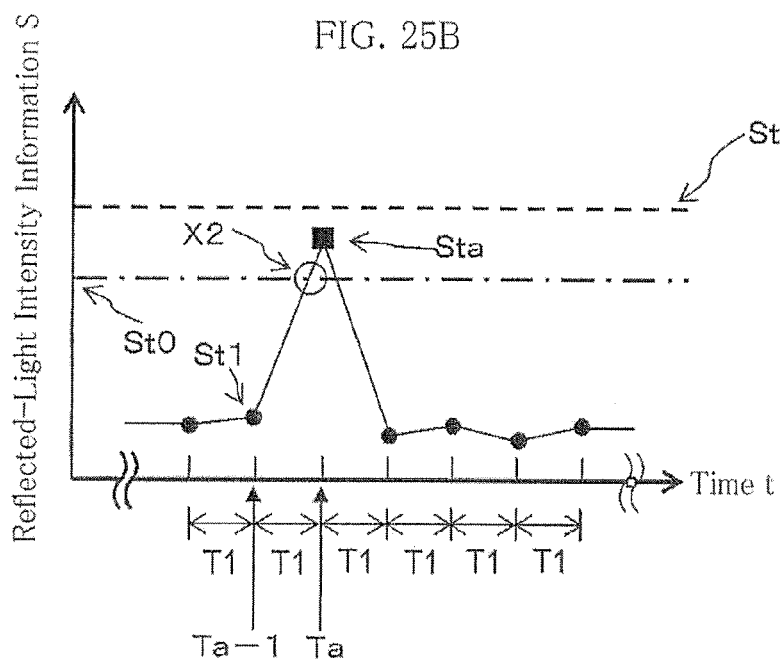
FIG. 25B shows a time chart for describing a signal which is processed in a controller in the adjustment mode according to the present invention.

FIG. 25B is a time chart showing a situation after the threshold value St has been adjusted. As understood from FIG. 25B, the new distance determining threshold value St0 is stored in the data memory 33A, and this new threshold value St0 is utilized in performing the same determination procedure as shown in FIG. 24B. This enables the touchless sensor 14 and the MCU 33 to detect the detection target when it is at the preset distance L. Specifically, by using the comparison controller 33B to compare reflected-light intensity information St1 obtained at Time Point Ta−1 which is a time point immediately before Time Point Ta with the subsequent reflected-light intensity information Sta obtained at Time Point Ta, to determine if there was an increase in the reflected-light intensity information S across the threshold value St as indicated by a reference symbol X2, between Time Point Ta−1 and Time Point Ta. This enables the touchless sensor 14 and the subsequent MCU 33 to detect the detection target at the preset distance L and to respond to the detection.

Figure 26A:
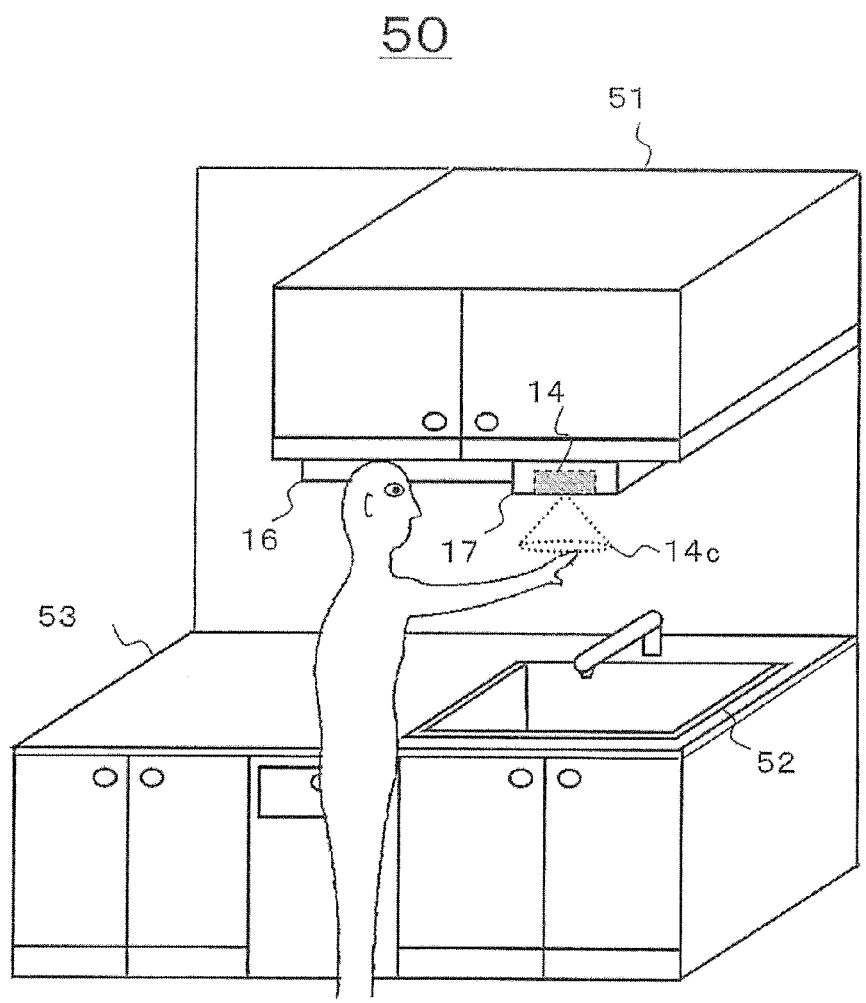
FIG. 26A is a conceptual sketch showing a suitable variation of an illuminator according to the present invention.
Figure 26B:
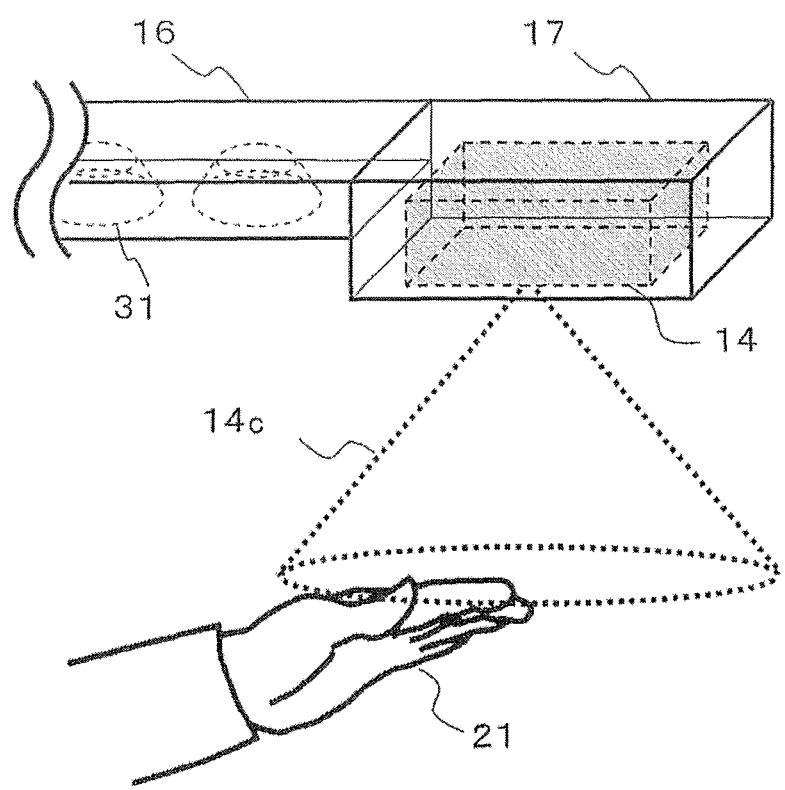
FIG. 26B is a conceptual sketch showing details of a kitchen illuminator as a suitable variation of lighting apparatus according to the present invention.

FIG. 26A and FIG. 26B show a preferred variation of the illuminator according to the present invention. Like the focal illuminator 10 in FIG. 17, a kitchen illuminator 50 includes a light source holder 16 and a operation section 17 in an integrated fashion whereas a light source holder 16 incorporates an unillustrated power supply circuit and control circuit for example. It should be noted here that the kitchen illuminator 50 in FIG. 26A includes a circuit which is equivalent to the one represented by the circuit block diagram in FIG. 19.

The kitchen illuminator 50 can suitably be used as a kitchen fitment installed in a kitchen. The kitchen fitment has, for example, a wall hung cabinet 51 which has at least one of its outside surface fixed to a wall of the kitchen. The kitchen illuminator 50 is fixed to a bottom surface of the wall hung cabinet 51, as a supplemental light to illuminate the space below, including a sink 52 and a top board 53 provided as a cooking space on top of a pedestal type cabinet.

Space around the kitchen fitment is a work space for a human operator to use water in the sink, to cook on the top board and so on. The kitchen illuminator 50 according to the present invention allows the operator to turn on/off the illuminator 50 in a non-contact manner. This provides safety by eliminating risks for electric shock hazard, and improves hygiene as well. The object 21, or the detection target, for activating the non-contact operation is provided by a hand of the operator in the present case. The operator should simply bring his/her hand into a detection field 14c as illustrated, to turn on/off the kitchen illuminator 50. FIG. 26A shows that an operator is bringing his hand as a detection target into a detection field 14c, i.e. a proximity space, of the touchless sensor 14 which is disposed in the operation section 17 in order to turn on/off the kitchen illuminator 50. FIG. 26B is an enlarged view of the area including the touchless sensor 14. The detection field 14c in the kitchen illuminators 50 is accurately adjusted using the adjusting process according to the present invention described above and therefore, the detection field 14c is highly accurate. This eliminates a problem that an object which is not within the detection field would accidentally activate the kitchen illuminator 50.

Figure 27:
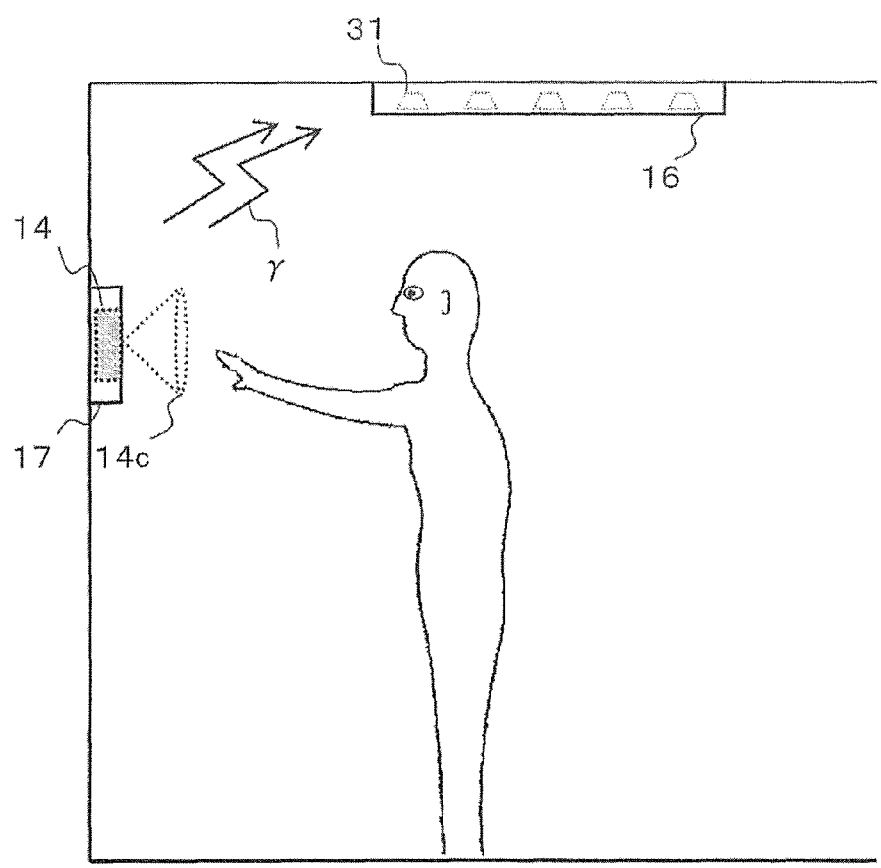
FIG. 27 illustrates a suitable variation of lighting apparatus according to the present invention.

FIG. 27 shows a preferred variation of the illuminator according to the present invention. The illuminator 60 is a so called ceiling light and includes a light source holder 16 and an operation section 17. The light source holder 16 is attached typically to a ceiling whereas the operation section 17 has at least an outside surface thereof fixed to or buried in a wall, for example, within a reach of an operator's hand. Specifically, the illuminator 60 in FIG. 27 has the light source holder 16 and the operation section 17 separated from each other. Such a configuration differs from those in FIG. 17, FIG. 26A or FIG. 26B. The light source holder 16 incorporates an unillustrated power unit and a controller. It should be noted here that the illuminators 60 includes a circuit which is equivalent to the one represented by the circuit block diagram in FIG. 19, and may include unillustrated remote-control transmitter and remote-control receiver. A preferred arrangement in such a case is that an ON-OFF signal y is transmitted once a hand of an operator comes in the detection field 14c of the touchless sensor 14. The signal may be whichever of infrared signal or so called radio frequency signal. Alternatively, a wired connection may be provided between the light source holder 16 and the operation section 17.

Even in the case like the illuminators 60 where the light source holder 16 and the operation section 17 are not structurally connected or integrally connected with each other, accuracy of the touchless activation using a touchless sensor is controlled by the touchless sensor 14 and the controller 33 in the operation section 17. Therefore, the adjustment method according to the present invention is effectively applicable in a manufacturing process of illuminators of this type.

Since the illuminator 60 has a light source holder 16 and an operation section 17 separated from each other, many variations are possible to different types of illuminators. In addition to the ceiling light as shown in FIG. 27 where the light source holder 16 is attached directly to the ceiling for overall lighting of the entire room, variations include a suspended light (unillustrated) in which the light source holder is suspended from a ceiling, a bracket light in which the light source holder is attached to a wall, an undercabinet light for illuminating commercial goods displayed on a shelf, and downlight buried into a ceiling.

Illuminators according to the present invention are turned on/off in a non-contact manner and can have a clearly defined field of response. Also, the method of adjusting illuminators according to the present invention makes use of an MCU in checking and adjusting the boundary of the field of response. This provides a high level of industrial applicability since it improves production yield in the manufacturing process of the illuminators.

Technical aspects of the illuminator and the adjusting method thereof provided by the present invention will be described below as appendices.

APPENDIX 1

An illuminator comprising:
a light source;
a touchless sensor for non-contact detection of approach or movement of a detection target; and
a controller for an ON/OFF control of the light source based on an output from the touchless sensor;
wherein the controller includes a data memory for storage of reflected-light intensity information regarding a reflected light coming from the detection target to the touchless sensor.

APPENDIX 2

The illuminator according to Appendix 1, wherein the controller performs the ON/OFF control to the light source upon approach of the detection target to a predetermined proximity from the touchless sensor.

APPENDIX 3

The illuminator according to Appendix 1 or Appendix 2, wherein the reflected-light intensity information stored in the data memory is rewritable.

APPENDIX 4

The illuminator according to one of Appendices 1 through 3, wherein the controller sends a signal for light intensity measurement of the reflected light to the touchless sensor at a predetermined timing.

APPENDIX 5

The illuminator according to one of Appendices 1 through 4, wherein the data memory in the controller stores a piece of reflected-light intensity information which indicates a specific distance as a threshold value for determining the approach of the detection target.

APPENDIX 6

The illuminator according to one of Appendices 1 through 5, wherein the controller is connected with an enabling means provided outside the controller, to enable and disable the light intensity measurement of the reflected light from the detection target to the touchless sensor.

APPENDIX 7

The illuminator according to one of Appendices 1 through 6, wherein the touchless sensor includes:
at least one light emitter which, if plural, are located at different positions within one plane for simultaneous or sequential emission of light;
a light receiver for detection of light reflected by the detection target and hitting the light receiver simultaneously or sequentially following the simultaneous or sequential emission of light from said at least one light emitter; and
a reflected-light intensity information generator for generation of at least a piece of reflected-light intensity information indicating an intensity of the reflected light detected by the light receiver; and
a data register for storage of the generated reflected-light intensity information.

APPENDIX 8

The illuminator according to Appendix 7, wherein each of said at least one light emitter is provided by an infrared LED which emits an infrared ray.

APPENDIX 9

The illuminator according to Appendix 7, wherein the controller compares the reflected-light intensity information sent from the touchless sensor at a predetermined timing with the threshold value stored in advance in the data memory, and performs the ON/OFF control of the light source if the reflected-light intensity information is determined to be greater than the threshold value.

APPENDIX 10

The illuminator according to Appendix 9, wherein the controller performs:
a step of receiving reflected-light intensity information and store it in the data memory at one time point;
a step of receiving reflected-light intensity information at another time point which is adjacent to said one time point; and
a step of determining, by using these pieces of information, whether or not received reflected-light intensity information is greater than the threshold value.

APPENDIX 11

The illuminator according to one of Appendices 1 through 10, further comprising a case incorporating the light source, the touchless sensor and the controller; and
an arm attached to the case.

APPENDIX 12

The illuminator according to Appendix 11, wherein the touchless sensor is disposed near an arm bracket to which the arm is attached.

APPENDIX 13

The illuminator according to one of Appendices 1 through 10, further comprising a case incorporating the light source, the touchless sensor and the controller, wherein the case is to be installed below a wall-hung fixture which has at least one outer surface fixed to a wall surface.

APPENDIX 14

The illuminator according to one of Appendices 1 through 10, wherein the light source is installed in a ceiling whereas at least one outer surface of a case including the touchless sensor and the controller is fixed to a wall surface other than the ceiling.

APPENDIX 15

The illuminator according to one of Appendices 1 through 14, wherein the light source includes at least one LED.

APPENDIX 16

An adjustment method for the illuminator according to Appendix 1, comprising:
a step of preparing an illuminator which includes a touchless sensor and a detection target;
a step of moving the detection target by a predetermined distance from the touchless sensor;
a step of emitting light from the touchless sensor to hit the detection target;
a step of detecting an intensity of light reflected by the detection target;
a step of generating reflected-light intensity information from the detected light intensity;
a step of comparing the reflected-light intensity information with a light intensity threshold value stored in the controller; and
a step of determining whether or not a range in which the touchless sensor and the controller respond to the detection target is within a predetermined specification.

APPENDIX 17

The adjustment method of the illuminator according to Appendix 16, further comprising:
a step of detecting an intensity of reflected infrared rays casted onto the touchless sensor;
a step of generating reflected-light intensity information from the detected light intensity;
a step of subtracting a predetermined marginal value from the reflected-light intensity information; and
a step of storing new reflected-light intensity information obtained by the subtraction in the controller as a new threshold value,
for a case where the range in which the touchless sensor and the controller respond to the detection target is not within the predetermined specification.

The invention claimed is:
1. An illuminator comprising:
a light source;
a touchless sensor for non-contact detection of approach or movement of a detection target in a range of a detection distance;
a control unit for an ON/OFF control of the light source based on an output from the touchless sensor; and
an enabling unit connected to the control unit,
wherein the control unit includes a data memory for storage of threshold value that defines the detection distance, and reflected-light intensity information regarding a reflected light coming from the detection target to the touchless sensor,
the control unit has a normal mode and an adjustment mode, the control unit performs the ON/OFF control in the normal mode, and the control unit adjusts in the adjustment mode the threshold value stored in the data memory, and
the enabling unit switches the normal mode and the adjustment mode.

2. The illuminator according to claim 1, wherein the control unit performs the ON/OFF control to the light source upon approach of the detection target to a predetermined proximity from the touchless sensor.

3. The illuminator according to claim 1, wherein the reflected-light intensity information stored in the data memory is rewritable.

4. The illuminator according to claim 1, wherein the control unit sends a signal for light intensity measurement of the reflected light to the touchless sensor at a predetermined timing.

5. The illuminator according to claim 1, wherein the touchless sensor includes:
at least one light emitter which, if plural, are located at different positions within one plane for simultaneous or sequential emission of light;
a light receiver for detection of light reflected by the detection target and hitting the light receiver simultaneously or sequentially following the simultaneous or sequential emission of light from said at least one light emitter; and
a reflected-light intensity information generator for generation of at least a piece of reflected-light intensity information indicating an intensity of the reflected light detected by the light receiver; and
a data register for storage of the generated reflected-light intensity information.

6. The illuminator according to claim 5, wherein each of said at least one light emitter is provided by an infrared LED which emits an infrared ray.

7. The illuminator according to claim 5, wherein the control unit compares the reflected-light intensity information sent from the touchless sensor at a predetermined timing with the threshold value stored in the data memory, and performs the ON/OFF control of the light source if the reflected-light intensity information is determined to be greater than the threshold value.

8. The illuminator according to claim 7, wherein the control unit performs:
a step of receiving reflected-light intensity information and store it in the data memory at one time point;
a step of receiving reflected-light intensity information at another time point which is adjacent to said one time point; and
a step of determining, by using these pieces of information, whether or not received reflected-light intensity information is greater than the threshold value.

9. The illuminator according to claim 1, further comprising: a case incorporating the light source, the touchless sensor and the control unit; and an arm attached to the case.

10. The illuminator according to claim 9, wherein the touchless sensor is disposed near an arm bracket to which the arm is attached.

11. The illuminator according to claim 1, further comprising a case incorporating the light source, the touchless sensor and the control unit, wherein the case is to be installed below a wall-hung fixture which has at least one outer surface fixed to a wall surface.

12. The illuminator according to claim 1, wherein the light source is installed in a ceiling whereas at least one outer surface of a case including the touchless sensor and the control unit is fixed to a wall surface other than the ceiling.

13. The illuminator according to claim 1, wherein the light source includes at least one LED.

14. An adjustment method for the illuminator according to claim 1, the method comprising:
- a step of preparing an illuminator which includes a touchless sensor and a detection target;
- a step of moving the detection target by a predetermined distance from the touchless sensor;
- a step of emitting light from the touchless sensor to hit the detection target;
- a step of detecting an intensity of light reflected by the detection target;
- a step of generating reflected-light intensity information from the detected light intensity;
- a step of comparing the reflected-light intensity information with a light intensity threshold value stored in the control unit; and
- a step of determining whether or not a range in which the touchless sensor and the control unit respond to the detection target is within a predetermined specification.

15. The adjustment method according to claim 14, further comprising:
- a step of detecting an intensity of reflected infrared rays casted onto the touchless sensor;
- a step of generating reflected-light intensity information from the detected light intensity;
- a step of subtracting a predetermined marginal value from the reflected-light intensity information; and
- a step of storing new reflected-light intensity information obtained by the subtraction in the control unit as a new threshold value,
- for a case where the range in which the touchless sensor and the control unit respond to the detection target is not within the predetermined specification.

16. The illuminator according to claim 1, wherein the enabling unit provides at least two kinds of signals to the control unit, and the normal mode and the adjustment mode are switched by the at least two kinds of signals provided by the enabling unit.

* * * * *